(12) United States Patent
Kato et al.

(10) Patent No.: US 8,692,718 B2
(45) Date of Patent: Apr. 8, 2014

(54) ANTENNA AND WIRELESS IC DEVICE

(75) Inventors: Noboru Kato, Takatsuki (JP); Yuya Dokai, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 236 days.

(21) Appl. No.: 13/083,626

(22) Filed: Apr. 11, 2011

(65) Prior Publication Data

US 2011/0181475 A1    Jul. 28, 2011

Related U.S. Application Data

(63) Continuation of application No. PCT/JP2009/069486, filed on Nov. 17, 2009.

(30) Foreign Application Priority Data

Nov. 17, 2008   (JP) ................................ 2008-293619
Jul. 22, 2009   (JP) ................................ 2009-171644

(51) Int. Cl.
    *H01Q 1/38*   (2006.01)

(52) U.S. Cl.
    USPC ............ 343/700 MS; 343/843; 343/850; 343/911; 340/10.1; 340/445

(58) Field of Classification Search
    USPC ......... 343/700, 843, 850, 911; 340/10.1, 445
    See application file for complete search history.

(56) References Cited

U.S. PATENT DOCUMENTS

| | | |
|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,528,222 A | 6/1996 | Moskowitz et al. |

(Continued)

FOREIGN PATENT DOCUMENTS

| CN | 101785145 A | 7/2010 |
|---|---|---|
| DE | 10 2005 042 444 A1 | 3/2007 |

(Continued)

OTHER PUBLICATIONS

Official communication issued in counterpart International Application No. PCT/JP2008/071502, mailed Feb. 24, 2009.

(Continued)

*Primary Examiner* — Allyson Trail
(74) *Attorney, Agent, or Firm* — Keating & Bennett, LLP

(57) ABSTRACT

An antenna and a wireless IC device that includes the antenna are provided for which the manufacturing process is simple and for which there is a low probability of a poor connection occurring between a feeder portion and a radiation electrode. An antenna includes a radiation electrode that is provided on a main surface of an insulator board, a ground electrode and/or a counter electrode that is arranged so as to oppose the radiation electrode, and a magnetic field electrode that is connected to the radiation electrode through a connection portion. The magnetic field electrode is defined by line-shaped electrodes and feeds a signal to the radiation electrode from a feeder portion defined by ends of the line-shaped electrodes through the magnetic field electrode.

19 Claims, 15 Drawing Sheets

(56) References Cited

U.S. PATENT DOCUMENTS

| | | | |
|---|---|---|---|
| 5,757,074 A | 5/1998 | Matloubian et al. | |
| 5,854,480 A | 12/1998 | Noto | |
| 5,903,239 A | 5/1999 | Takahashi et al. | |
| 5,936,150 A | 8/1999 | Kobrin et al. | |
| 5,955,723 A | 9/1999 | Reiner | |
| 5,995,006 A | 11/1999 | Walsh | |
| 6,104,311 A | 8/2000 | Lastinger | |
| 6,107,920 A | 8/2000 | Eberhardt et al. | |
| 6,172,608 B1 | 1/2001 | Cole | |
| 6,181,287 B1 | 1/2001 | Beigel | |
| 6,190,942 B1 | 2/2001 | Wilm et al. | |
| 6,249,258 B1 | 6/2001 | Bloch et al. | |
| 6,259,369 B1 | 7/2001 | Monico | |
| 6,271,803 B1 | 8/2001 | Watanabe et al. | |
| 6,335,686 B1 | 1/2002 | Goff et al. | |
| 6,362,784 B1 | 3/2002 | Kane et al. | |
| 6,367,143 B1 | 4/2002 | Sugimura | |
| 6,378,774 B1 | 4/2002 | Emori et al. | |
| 6,406,990 B1 | 6/2002 | Kawai | |
| 6,448,874 B1 | 9/2002 | Shiino et al. | |
| 6,462,716 B1 | 10/2002 | Kushihi | |
| 6,542,050 B1 | 4/2003 | Arai et al. | |
| 6,600,459 B2 | 7/2003 | Yokoshima et al. | |
| 6,634,564 B2 | 10/2003 | Kuramochi | |
| 6,664,645 B2 | 12/2003 | Kawai | |
| 6,763,254 B2 | 7/2004 | Nishikawa | |
| 6,812,707 B2 | 11/2004 | Yonezawa et al. | |
| 6,828,881 B2 | 12/2004 | Mizutani et al. | |
| 6,837,438 B1 | 1/2005 | Takasugi et al. | |
| 6,861,731 B2 | 3/2005 | Buijsman et al. | |
| 6,927,738 B2 | 8/2005 | Senba et al. | |
| 6,963,729 B2 | 11/2005 | Uozumi | |
| 7,088,249 B2 | 8/2006 | Senba et al. | |
| 7,088,307 B2 | 8/2006 | Imaizumi | |
| 7,112,952 B2 | 9/2006 | Arai et al. | |
| 7,119,693 B1 | 10/2006 | Devilbiss | |
| 7,129,834 B2 | 10/2006 | Naruse et al. | |
| 7,215,295 B2 | 5/2007 | Egbert | |
| 7,248,221 B2 | 7/2007 | Kai et al. | |
| 7,250,910 B2 | 7/2007 | Yoshikawa et al. | |
| 7,276,929 B2 | 10/2007 | Arai et al. | |
| 7,317,396 B2 | 1/2008 | Ujino | |
| 7,405,664 B2 | 7/2008 | Sakama et al. | |
| 7,589,675 B2 | 9/2009 | Chang et al. | |
| 7,696,947 B2 | 4/2010 | Gallschuetz et al. | |
| 7,830,311 B2 | 11/2010 | Kataya et al. | |
| 7,848,171 B2 | 12/2010 | Miyako | |
| 8,026,818 B2 | 9/2011 | Cote et al. | |
| 8,081,121 B2 | 12/2011 | Kato et al. | |
| 8,177,138 B2 | 5/2012 | Kato et al. | |
| 8,237,622 B2 | 8/2012 | Furumura et al. | |
| 2001/0015701 A1* | 8/2001 | Ito et al. | 343/700 MS |
| 2002/0011967 A1 | 1/2002 | Goff et al. | |
| 2002/0015002 A1 | 2/2002 | Yasukawa et al. | |
| 2002/0044092 A1 | 4/2002 | Kushihi | |
| 2002/0067316 A1 | 6/2002 | Yokoshima et al. | |
| 2002/0093457 A1 | 7/2002 | Hamada et al. | |
| 2003/0006901 A1 | 1/2003 | Kim et al. | |
| 2003/0020661 A1 | 1/2003 | Sato | |
| 2003/0045324 A1 | 3/2003 | Nagumo et al. | |
| 2003/0169153 A1 | 9/2003 | Muller | |
| 2004/0001027 A1 | 1/2004 | Killen et al. | |
| 2004/0026519 A1 | 2/2004 | Usami et al. | |
| 2004/0056823 A1 | 3/2004 | Zuk et al. | |
| 2004/0066617 A1 | 4/2004 | Hirabayashi et al. | |
| 2004/0217915 A1 | 11/2004 | Imaizumi | |
| 2004/0219956 A1 | 11/2004 | Iwai et al. | |
| 2004/0227673 A1 | 11/2004 | Iwai et al. | |
| 2004/0252064 A1 | 12/2004 | Yuanzhu | |
| 2005/0092836 A1 | 5/2005 | Kudo | |
| 2005/0099337 A1 | 5/2005 | Takei et al. | |
| 2005/0125093 A1 | 6/2005 | Kikuchi et al. | |
| 2005/0134460 A1 | 6/2005 | Usami | |
| 2005/0134506 A1 | 6/2005 | Egbert | |
| 2005/0138798 A1 | 6/2005 | Sakama et al. | |
| 2005/0140512 A1 | 6/2005 | Sakama et al. | |
| 2005/0179529 A1* | 8/2005 | Sato | 340/445 |
| 2005/0232412 A1 | 10/2005 | Ichihara et al. | |
| 2005/0236623 A1 | 10/2005 | Takechi et al. | |
| 2005/0275539 A1 | 12/2005 | Sakama et al. | |
| 2006/0001138 A1 | 1/2006 | Sakama et al. | |
| 2006/0044192 A1 | 3/2006 | Egbert | |
| 2006/0055601 A1 | 3/2006 | Kameda et al. | |
| 2006/0071084 A1 | 4/2006 | Detig et al. | |
| 2006/0109185 A1 | 5/2006 | Iwai et al. | |
| 2006/0145872 A1 | 7/2006 | Tanaka et al. | |
| 2006/0158380 A1 | 7/2006 | Son et al. | |
| 2006/0170606 A1 | 8/2006 | Yamagajo et al. | |
| 2006/0214801 A1 | 9/2006 | Murofushi et al. | |
| 2006/0220871 A1 | 10/2006 | Baba et al. | |
| 2006/0244676 A1 | 11/2006 | Uesaka | |
| 2006/0267138 A1 | 11/2006 | Kobayashi | |
| 2007/0004028 A1 | 1/2007 | Lair et al. | |
| 2007/0018893 A1 | 1/2007 | Kai et al. | |
| 2007/0040028 A1 | 2/2007 | Kawamata | |
| 2007/0052613 A1 | 3/2007 | Gallschuetz et al. | |
| 2007/0057854 A1 | 3/2007 | Oodachi et al. | |
| 2007/0069037 A1 | 3/2007 | Kawai | |
| 2007/0132591 A1 | 6/2007 | Khatri | |
| 2007/0164414 A1 | 7/2007 | Dokai et al. | |
| 2007/0200782 A1 | 8/2007 | Hayama et al. | |
| 2007/0252700 A1 | 11/2007 | Ishihara et al. | |
| 2007/0252703 A1 | 11/2007 | Kato et al. | |
| 2007/0285335 A1 | 12/2007 | Bungo et al. | |
| 2007/0290928 A1 | 12/2007 | Chang et al. | |
| 2008/0024156 A1 | 1/2008 | Arai et al. | |
| 2008/0087990 A1 | 4/2008 | Kato et al. | |
| 2008/0169905 A1 | 7/2008 | Slatter | |
| 2008/0272885 A1 | 11/2008 | Atherton | |
| 2009/0002130 A1 | 1/2009 | Kato | |
| 2009/0009007 A1 | 1/2009 | Kato et al. | |
| 2009/0021446 A1 | 1/2009 | Kataya et al. | |
| 2009/0065594 A1 | 3/2009 | Kato et al. | |
| 2009/0109102 A1 | 4/2009 | Dokai et al. | |
| 2009/0160719 A1 | 6/2009 | Kato et al. | |
| 2009/0201116 A1 | 8/2009 | Orihara | |
| 2009/0231106 A1 | 9/2009 | Okamura | |
| 2009/0262041 A1 | 10/2009 | Ikemoto et al. | |
| 2009/0278687 A1 | 11/2009 | Kato | |
| 2009/0302121 A1 | 12/2009 | Shioya et al. | |
| 2010/0181379 A1* | 7/2010 | Okegawa et al. | 235/488 |

FOREIGN PATENT DOCUMENTS

| | | |
|---|---|---|
| DE | 10 2006 054 078 A1 | 11/2007 |
| DE | 10 2006 057 369 A1 | 6/2008 |
| DE | 11 2009 002 399 T5 | 8/2012 |
| EP | 0 694 874 A2 | 1/1996 |
| EP | 0 977 145 A2 | 2/2000 |
| EP | 1 010 543 A1 | 6/2000 |
| EP | 1 160 915 A2 | 12/2001 |
| EP | 1 170 795 A2 | 1/2002 |
| EP | 1 227 540 A1 | 7/2002 |
| EP | 1 280 232 A1 | 1/2003 |
| EP | 1 280 350 A1 | 1/2003 |
| EP | 1 343 223 A1 | 9/2003 |
| EP | 1 357 511 A2 | 10/2003 |
| EP | 1 548 872 A1 | 6/2005 |
| EP | 1 703 589 A1 | 9/2006 |
| EP | 1 744 398 A1 | 1/2007 |
| EP | 1 796 204 A1 | 6/2007 |
| EP | 1 841 005 A1 | 10/2007 |
| EP | 1 865 574 A1 | 12/2007 |
| EP | 1 870 834 A1 | 12/2007 |
| EP | 1 942 553 A1 | 7/2008 |
| EP | 1 976 056 A1 | 10/2008 |
| EP | 1 993 170 A1 | 11/2008 |
| EP | 2 009 738 A1 | 12/2008 |
| EP | 2 012 258 A1 | 1/2009 |
| EP | 2 056 400 A1 | 5/2009 |
| EP | 2 096 709 A1 | 9/2009 |
| EP | 2 148 449 A1 | 1/2010 |
| EP | 2 166 490 A1 | 3/2010 |
| EP | 2 166 618 A1 | 3/2010 |

(56) References Cited

FOREIGN PATENT DOCUMENTS

| | | |
|---|---|---|
| EP | 2 251 933 A1 | 11/2010 |
| EP | 2 251 934 A1 | 11/2010 |
| EP | 2 256 861 A1 | 12/2010 |
| EP | 2 264 831 A1 | 12/2010 |
| EP | 2 320 519 A1 | 5/2011 |
| GB | 2 305 075 A | 3/1997 |
| JP | 50-143451 A | 11/1975 |
| JP | 62-127140 U | 8/1987 |
| JP | 02-164105 A | 6/1990 |
| JP | 03-262313 A | 11/1991 |
| JP | 04-150011 A | 5/1992 |
| JP | 04-167500 A | 6/1992 |
| JP | 05-327331 A | 12/1993 |
| JP | 6-53733 A | 2/1994 |
| JP | 06-077729 A | 3/1994 |
| JP | 06-177635 A | 6/1994 |
| JP | 6-260949 A | 9/1994 |
| JP | 07-183836 A | 7/1995 |
| JP | 08-056113 A | 2/1996 |
| JP | 8-87580 A | 4/1996 |
| JP | 08-088586 A | 4/1996 |
| JP | 11-149537 A | 6/1996 |
| JP | 08-176421 A | 7/1996 |
| JP | 08-180160 A | 7/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-035025 A | 2/1997 |
| JP | 9-93029 A | 4/1997 |
| JP | 09-245381 A | 9/1997 |
| JP | 09-252217 A | 9/1997 |
| JP | 09-270623 A | 10/1997 |
| JP | 9-512367 A | 12/1997 |
| JP | 10-69533 A | 3/1998 |
| JP | 10-069533 A | 3/1998 |
| JP | 10-505466 A | 5/1998 |
| JP | 10-171954 A | 6/1998 |
| JP | 10-193849 A | 7/1998 |
| JP | 10-193851 A | 7/1998 |
| JP | 10-293828 A | 11/1998 |
| JP | 11-039441 A | 2/1999 |
| JP | 11-075329 A | 3/1999 |
| JP | 11-085937 A | 3/1999 |
| JP | 11-88241 A | 3/1999 |
| JP | 11-102424 A | 4/1999 |
| JP | 11-103209 A | 4/1999 |
| JP | 11-149536 A | 6/1999 |
| JP | 11-149538 A | 6/1999 |
| JP | 11-219420 A | 8/1999 |
| JP | 11-220319 A | 8/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |
| JP | 2000-090207 A | 3/2000 |
| JP | 2000-132643 A | 5/2000 |
| JP | 2000-137778 A | 5/2000 |
| JP | 2000-137779 A | 5/2000 |
| JP | 2000-137785 A | 5/2000 |
| JP | 2000-148948 A | 5/2000 |
| JP | 2000-172812 A | 6/2000 |
| JP | 2000-209013 A | 7/2000 |
| JP | 2000-222540 A | 8/2000 |
| JP | 2000-510271 A | 8/2000 |
| JP | 2000-242754 A | 9/2000 |
| JP | 2000-243797 A | 9/2000 |
| JP | 2000-251049 A | 9/2000 |
| JP | 2000-261230 A | 9/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 3075400 U | 11/2000 |
| JP | 2000-349680 A | 12/2000 |
| JP | 2001-10264 A | 1/2001 |
| JP | 2001-028036 A | 1/2001 |
| JP | 2007-18067 A | 1/2001 |
| JP | 2001-043340 A | 2/2001 |
| JP | 2001-66990 A | 3/2001 |
| JP | 2001-76111 A | 3/2001 |
| JP | 2001-505682 A | 4/2001 |
| JP | 2001-168628 A | 6/2001 |
| JP | 2001-188890 A | 7/2001 |
| JP | 2001-240046 A | 9/2001 |
| JP | 2001-256457 A | 9/2001 |
| JP | 2001-257292 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-339226 A | 12/2001 |
| JP | 2001-344574 A | 12/2001 |
| JP | 2001-351084 A | 12/2001 |
| JP | 2001-352176 A | 12/2001 |
| JP | 2002-024776 A | 1/2002 |
| JP | 2002-026513 A | 1/2002 |
| JP | 2002-32731 A | 1/2002 |
| JP | 2002-042076 A | 2/2002 |
| JP | 2002-063557 A | 2/2002 |
| JP | 2002-505645 A | 2/2002 |
| JP | 2002-076750 A | 3/2002 |
| JP | 2002-76750 A | 3/2002 |
| JP | 2002-150245 A | 5/2002 |
| JP | 2002-157564 A | 5/2002 |
| JP | 2002-158529 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-522849 A | 7/2002 |
| JP | 2002-230128 A | 8/2002 |
| JP | 2002-232221 A | 8/2002 |
| JP | 2002-252117 A | 9/2002 |
| JP | 2002-259934 A | 9/2002 |
| JP | 2002-280821 A | 9/2002 |
| JP | 2002-298109 A | 10/2002 |
| JP | 2002-308437 A | 10/2002 |
| JP | 2002-319008 A | 10/2002 |
| JP | 2002-319009 A | 10/2002 |
| JP | 2002-319812 A | 10/2002 |
| JP | 2002-362613 A | 12/2002 |
| JP | 2002-373029 A | 12/2002 |
| JP | 2002-373323 A | 12/2002 |
| JP | 2002-374139 A | 12/2002 |
| JP | 2003-006599 A | 1/2003 |
| JP | 2003-016412 A | 1/2003 |
| JP | 2003-026177 A | 1/2003 |
| JP | 2003-030612 A | 1/2003 |
| JP | 2003-44789 A | 2/2003 |
| JP | 2003-046318 A | 2/2003 |
| JP | 2003-58840 A | 2/2003 |
| JP | 2003-067711 A | 3/2003 |
| JP | 2003-069335 A | 3/2003 |
| JP | 2003-076947 A | 3/2003 |
| JP | 2003-76963 A | 3/2003 |
| JP | 2003-78333 A | 3/2003 |
| JP | 2003-078336 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |

(56) References Cited

FOREIGN PATENT DOCUMENTS

| | | |
|---|---|---|
| JP | 2003-158414 A | 5/2003 |
| JP | 2003-168760 A | 6/2003 |
| JP | 2003-179565 A | 6/2003 |
| JP | 2003-187207 A | 7/2003 |
| JP | 2003-187211 A | 7/2003 |
| JP | 2003-188338 A | 7/2003 |
| JP | 2003-188620 A | 7/2003 |
| JP | 2003-198230 A | 7/2003 |
| JP | 2003-209421 A | 7/2003 |
| JP | 2003-216919 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-249813 A | 9/2003 |
| JP | 2003-529163 A | 9/2003 |
| JP | 2003-288560 A | 10/2003 |
| JP | 2003-309418 A | 10/2003 |
| JP | 2003-317060 A | 11/2003 |
| JP | 2003-331246 A | 11/2003 |
| JP | 2003-332820 A | 11/2003 |
| JP | 2003-536302 A | 12/2003 |
| JP | 2004-040597 A | 2/2004 |
| JP | 2004-505481 A | 2/2004 |
| JP | 2004-082775 A | 3/2004 |
| JP | 2004-88218 A | 3/2004 |
| JP | 2004-93693 A | 3/2004 |
| JP | 2004-096566 A | 3/2004 |
| JP | 2004-127230 A | 4/2004 |
| JP | 2004-213582 A | 7/2004 |
| JP | 2004-519916 A | 7/2004 |
| JP | 2004-234595 A | 8/2004 |
| JP | 2004-253858 A | 9/2004 |
| JP | 2004-527864 A | 9/2004 |
| JP | 2004-280390 A | 10/2004 |
| JP | 2004-287767 A | 10/2004 |
| JP | 2004-297249 A | 10/2004 |
| JP | 2004-297681 A | 10/2004 |
| JP | 2004-304370 A | 10/2004 |
| JP | 2004-319848 A | 11/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-5866 A | 1/2005 |
| JP | 2005-18156 A | 1/2005 |
| JP | 2005-124061 A | 5/2005 |
| JP | 2005-128592 A | 5/2005 |
| JP | 2005-129019 A | 5/2005 |
| JP | 2005-135132 A | 5/2005 |
| JP | 2005-136528 A | 5/2005 |
| JP | 2005-137032 A | 5/2005 |
| JP | 3653099 B2 | 5/2005 |
| JP | 2005-165839 A | 6/2005 |
| JP | 2005-167327 A | 6/2005 |
| JP | 2005-167813 A | 6/2005 |
| JP | 2005-190417 A | 7/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-252853 A | 9/2005 |
| JP | 2005-275870 A | 10/2005 |
| JP | 2005-284352 A | 10/2005 |
| JP | 2005-293537 A | 10/2005 |
| JP | 2005-295135 A | 10/2005 |
| JP | 2005-311205 A | 11/2005 |
| JP | 2005-321305 A | 11/2005 |
| JP | 2005-322119 A | 11/2005 |
| JP | 2005-335755 A | 12/2005 |
| JP | 2005-340759 A | 12/2005 |
| JP | 2005-345802 A | 12/2005 |
| JP | 2005-346820 A | 12/2005 |
| JP | 2005-352858 A | 12/2005 |
| JP | 2006-13976 A | 1/2006 |
| JP | 2006-025390 A | 1/2006 |
| JP | 2006-031766 A | 2/2006 |
| JP | 2006-39902 A | 2/2006 |
| JP | 2006-42059 A | 2/2006 |
| JP | 2006-42097 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-107296 A | 4/2006 |
| JP | 2006-513594 A | 4/2006 |
| JP | 2006-148518 A | 6/2006 |
| JP | 2006-151402 A | 6/2006 |
| JP | 2006-174151 A | 6/2006 |
| JP | 2006-195795 A | 7/2006 |
| JP | 2006-203187 A | 8/2006 |
| JP | 2006-203852 A | 8/2006 |
| JP | 2006-217000 A | 8/2006 |
| JP | 2006-232292 A | 9/2006 |
| JP | 2006-237674 A | 9/2006 |
| JP | 2006-270212 A | 10/2006 |
| JP | 2006-270766 A | 10/2006 |
| JP | 2006-285911 A | 10/2006 |
| JP | 2006-295879 A | 10/2006 |
| JP | 2006-302219 A | 11/2006 |
| JP | 2006-309401 A | 11/2006 |
| JP | 2006-311239 A | 11/2006 |
| JP | 2006-323481 A | 11/2006 |
| JP | 2006-339964 A | 12/2006 |
| JP | 2007-007888 A | 1/2007 |
| JP | 2007-13120 A | 1/2007 |
| JP | 2007-28002 A | 2/2007 |
| JP | 2007-043535 A | 2/2007 |
| JP | 2007-048126 A | 2/2007 |
| JP | 2007-65822 A | 3/2007 |
| JP | 2007-79687 A | 3/2007 |
| JP | 2007-81712 A | 3/2007 |
| JP | 2007-096768 A | 4/2007 |
| JP | 2007-102348 A | 4/2007 |
| JP | 2007-122542 A | 5/2007 |
| JP | 2007-150642 A | 6/2007 |
| JP | 2007-150868 A | 6/2007 |
| JP | 2007-159083 A | 6/2007 |
| JP | 2007-159129 A | 6/2007 |
| JP | 2007-172369 A | 7/2007 |
| JP | 2007-172527 A | 7/2007 |
| JP | 2007-228325 A | 9/2007 |
| JP | 2007-266999 A | 10/2007 |
| JP | 2007-287128 A | 11/2007 |
| JP | 2007-312350 A | 11/2007 |
| JP | 2007-324865 A | 12/2007 |
| JP | 2008-033716 A | 2/2008 |
| JP | 2008-72243 A | 3/2008 |
| JP | 4069958 B2 | 4/2008 |
| JP | 2008-107947 A | 5/2008 |
| JP | 2008-148345 A | 6/2008 |
| JP | 2008-519347 A | 6/2008 |
| JP | 2008-160874 A | 7/2008 |
| JP | 2008-293619 A | 12/2008 |
| JP | 11-175678 A | 1/2009 |
| JP | 2009-25870 A | 2/2009 |
| JP | 2009-027291 A | 2/2009 |
| JP | 2009-27291 A | 2/2009 |
| JP | 2009-043223 A | 2/2009 |
| JP | 2009-044715 A | 2/2009 |
| JP | 2009-053741 A | 3/2009 |
| JP | 2009-053964 A | 3/2009 |
| JP | 2009-171644 A | 7/2009 |
| JP | 2009-260758 A | 11/2009 |
| JP | 4630796 B2 | 2/2011 |
| NL | 9100176 A | 3/1992 |
| NL | 9100347 A | 3/1992 |
| WO | 99/67754 A1 | 12/1999 |

(56) References Cited

FOREIGN PATENT DOCUMENTS

| | | |
|---|---|---|
| WO | 00/10122 A2 | 2/2000 |
| WO | 01/95242 A2 | 12/2001 |
| WO | 02/061675 A1 | 8/2002 |
| WO | 02/097723 A1 | 12/2002 |
| WO | 03/079305 A1 | 9/2003 |
| WO | 2004/036772 A1 | 4/2004 |
| WO | 2004/070879 A | 8/2004 |
| WO | 2004/072892 A1 | 8/2004 |
| WO | 2005/066889 A1 | 7/2005 |
| WO | 2005/073937 A | 8/2005 |
| WO | 2005/091434 A1 | 9/2005 |
| WO | 2005/115849 A1 | 12/2005 |
| WO | 2006/045682 A | 5/2006 |
| WO | 2006/048663 A1 | 5/2006 |
| WO | 2006/114821 A1 | 11/2006 |
| WO | 2007/083574 A1 | 7/2007 |
| WO | 2007/083575 A1 | 7/2007 |
| WO | 2007/086130 A1 | 8/2007 |
| WO | 2007/102360 A1 | 9/2007 |
| WO | 2007/119310 A1 | 10/2007 |
| WO | 2007/122870 A1 | 11/2007 |
| WO | 2007/125683 A1 | 11/2007 |
| WO | 2007/138857 A1 | 12/2007 |
| WO | 2008/007606 A | 1/2008 |
| WO | 2008/050689 A1 | 5/2008 |
| WO | 2008/079827 A1 | 7/2008 |
| WO | 2008/081699 A1 | 7/2008 |
| WO | 2008/126458 A1 | 10/2008 |
| WO | 2008/126649 | 10/2008 |
| WO | 2008/140037 A1 | 11/2008 |
| WO | 2009/011376 A1 | 1/2009 |
| WO | 2009/081719 A1 | 7/2009 |
| WO | 2009/110381 A1 | 9/2009 |

OTHER PUBLICATIONS

Kato et al.: "Wireless IC Device and Manufacturing Method Thereof,"; U.S. Appl. No. 12/432,854, filed Apr. 30, 2009.
Official communication issued in counterpart International Application No. PCT/JP2008/058168, mailed Aug. 12, 2008.
Official communication issued in counterpart International Application No. PCT/JP2008/062886, mailed Oct. 21, 2008.
Kato et al.: "Wireless IC Device,"; U.S. Appl. No. 12/469,896, filed May 21, 2009.
Ikemoto et al.: "Wireless IC Device,"; U.S. Appl. No. 12/496,709, filed Jul. 2, 2009.
Official communication issued in counterpart International Application No. PCT/JP2008/062947, mailed Aug. 19, 2008.
Official Communication issued in counterpart International Application No. PCT/JP2008/056026, mailed Jul. 1, 2008.
Ikemoto et al.: "Wireless IC Device and Electronic Apparatus," U.S. Appl. No. 12/503,188, filed Jul. 15, 2009.
Official communication issued in counterpart International Application No. PCT/JP2008/055567, mailed May 20, 2008.
Official communication issued in counterpart International Application No. PCT/JP2008/051853, mailed Apr. 22, 2008.
Official communication issued in counterpart International Application No. PCT/JP2008/057239, mailed Jul. 22, 2008.
Kimura et al.: "Wireless IC Device,"; U.S. Appl. No. 12/510,338, filed Jul. 28, 2009.
Kato et al.: "Wireless IC Device,"; U.S. Appl. No. 12/510,340, filed Jul. 28, 2009.
Kato: "Wireless IC Device,"; U.S. Appl. No. 12/510,344, filed Jul. 28, 2009.
Kato et al.: "Wireless IC Device,"; U.S. Appl. No. 12/510,347, filed Jul. 28, 2009.
Official communication issued in counterpart European Application No. 08 77 7758, dated on Jun. 30, 2009.
Official communication issued in counterpart Japanese Application No. 2008-103741, mailed on May 26, 2009.
Official communication issued in counterpart Japanese Application No. 2008-103742, mailed on May 26, 2009.
Official communication issued in International Application No. PCT/JP2008/050358, mailed on Mar. 25, 2008.
Official communication issued in International Application No. PCT/JP2008/050356, mailed on Mar. 25, 2008.
Osamura et al.: "Packaging Material With Electromagnetic Coupling Module,"; U.S. Appl. No. 12/536,663, filed Aug. 6, 2009.
Osamura et al.: "Packaging Material With Electromagnetic Coupling Module,"; U.S. Appl. No. 12/536,669, filed Aug. 6, 2009.
Dokai et al.: "Wireless IC Device and Component for Wireless IC Device,"; U.S. Appl. No. 12/543,553, filed Aug. 19, 2009.
Shioya et al.: "Wireless IC Device,"; U.S. Appl. No. 12/551,037, filed Aug. 31, 2009.
Ikemoto: "Wireless IC Device and Manufacturing Method Thereof,"; U.S. Appl. No. 12/579,672, filed Oct. 15, 2009.
Official communication issued in International Application No. PCT/JP2008/058614, mailed on Jun. 10, 2008.
Official Communication issued in International Patent Application No. PCT/JP2009/069486, mailed on Mar. 2, 2010.
Kato: "Radio IC Device"; U.S. Appl. No. 13/080,775, filed Apr. 6, 2011.
Official Communication issued in International Application No. PCT/JP2007/066007, mailed on Nov. 27, 2007.
Dokai et al.: "Wireless IC Device and Component for Wireless IC Device"; U.S. Appl. No. 12/359,690, filed Jan. 26, 2009.
Dokai et al.: "Test System for Radio Frequency IC Devices and Method of Manufacturing Radio Frequency IC Devices Using the Same"; U.S. Appl. No. 12/388,826, filed Feb. 19, 2009.
Official Communication issued in International Application No. PCT/JP2008/061955, mailed on Sep. 30, 2008.
Official Communication issued in International Application No. PCT/JP2007/066721, mailed on Nov. 27, 2007.
Official Communication issued in International Application No. PCT/JP2007/070460, mailed on Dec. 11, 2007.
Kato et al.: "Wireless IC Device"; U.S. Appl. No. 12/390,556, filed Feb. 23, 2009.
Kato et al.: "Inductively Coupled Module and Item With Inductively Coupled Module"; U.S. Appl. No. 12/398,497, filed Mar. 5, 2009.
Official Communication issued in International Patent Application No. PCT/JP2008/050945, mailed on May 1, 2008.
Kato et al.: "Article Having Electromagnetic Coupling Module Attached Thereto"; U.S. Appl. No. 12/401,767, filed Mar. 11, 2009.
Taniguchi et al.: "Antenna Device and Radio Frequency IC Device"; U.S. Appl. No. 12/326,117, filed Dec. 2, 2008.
Official Communication issued in International Patent Application No. PCT/JP2008/061442, mailed on Jul. 22, 2008.
Kato et al.: "Container With Electromagnetic Coupling Module"; U.S. Appl. No. 12/426,369, filed Apr. 20, 2009.
Kato: "Wireless IC Device"; U.S. Appl. No. 12/429,346, filed Apr. 24, 2009.
Official Communication issued in corresponding German Patent Application No. 11 2009 002 384.3, mailed on Dec. 6, 2012.
Official Communication issued in International Patent Application No. PCT/JP2009/056934, mailed on Jun. 30, 2009.
Kato et al.: "Wireless IC Device"; U.S. Appl. No. 12/903,242, filed Oct. 13, 2010.
Kato et al.: "Wireless IC Device"; U.S. Appl. No. 12/940,103, filed Nov. 5, 2010.
Kato et al.: "Wireless IC Device System and Method of Determining Authenticity of Wireless IC Device"; U.S. Appl. No. 12/940,105, filed Nov. 5, 2010.
Official Communication issued in International Patent Application No. PCT/JP2009/059669, mailed on Aug. 25, 2009.
Official Communication issued in International Patent Application No. PCT/JP2009/062181, mailed on Oct. 13, 2009.
Official Communication issued in corresponding Japanese Application No. 2010-501323, mailed on Apr. 6, 2010.
Kato et al.: "Component of Wireless IC Device and Wireless IC Device"; U.S. Appl. No. 12/944,099, filed Nov. 11, 2010.
Kato et al.: "Wireless IC Device and Manufacturing Method Thereof"; U.S. Appl. No. 12/961,599, filed Dec. 7, 2010.
Kataya et al.: "Radio Frequency IC Device and Electronic Apparatus"; U.S. Appl. No. 12/959,454, filed Dec. 3, 2010.

(56) References Cited

OTHER PUBLICATIONS

Ikemoto et al.:"Radio IC Device"; U.S. Appl. No. 12/981,582, filed Dec. 30, 2010.
Official Communication issued in International Patent Application No. PCT/JP2009/062801, mailed on Oct. 27, 2009.
Ikemoto et al.: "Wireless IC Device and Electronic Apparatus"; U.S. Appl. No. 13/022,695, filed Feb. 8, 2011.
Official Communication issued in International Patent Application No. PCT/JP2009/067778, mailed on Jan. 26, 2010.
Kato: "Wireless IC Device and Method for Manufacturing Same"; U.S. Appl. No. 13/022,693, filed Feb. 8, 2011.
Kato: "Wireless IC Device"; U.S. Appl. No. 13/080,781, filed Apr. 6, 2011.
Official Communication issued in International Patent Application No. PCT/JP2008/063025, mailed on Aug. 12, 2008.
Kato et al.: "Wireless IC Device,"; U.S. Appl. No. 12/603,608, filed Oct. 22, 2009.
Kato et al.: "Wireless IC Device,"; U.S. Appl. No. 12/688,072, filed Jan. 15, 2010.
Official Communication issued in International Patent Application No. PCT/JP2009/053693, mailed on Jun. 9, 2009.
Kato: "Composite Antenna,"; U.S. Appl. No. 12/845,846, filed Jul. 29, 2010.
Official Communication issued in International Patent Application No. PCT/JP2009/053690, mailed on Jun. 2, 2009.
Kato et al.: "Radio Frequency IC Device and Radio Communication System,"; U.S. Appl. No. 12/859,340, filed Aug. 19, 2010.
Official Communication issued in International Patent Application No. PCT/JP2009/055758, mailed on Jun. 23, 2009.
Kato et al.: "Wireless IC Device,"; U.S. Appl. No. 12/859,880, filed Aug. 20, 2010.
Official Communication issued in International Patent Application No. PCT/JP2009/057482, mailed on Jul. 21, 2009.
Kataya et al.: "Wireless IC Device, Electronic Apparatus, and Method for Adjusting Resonant Frequency of Wireless IC Device,"; U.S. Appl. No. 12/861,945, filed Aug. 24, 2010.
Kato: "Wireless IC Device and Electromagnetic Coupling Module,"; U.S. Appl. No. 12/890,895, filed Sep. 27, 2010.
Official Communication issued in International Patent Application No. PCT/JP2009/059410, mailed on Aug. 4, 2009.
Kato et al.: "Wireless IC Device"; U.S. Appl. No. 12/902,174, filed Oct. 12, 2010.
Official Communication issued in International Patent Application No. PCT/JP2009/059259, mailed on Aug. 11, 2009.
Official Communication issued in corresponding Japanese Patent Application No. 2010-506742, mailed on Apr. 6, 2010.
Official Communication issued in International Patent Application No. PCT/JP2009/056698, mailed on Jul. 7, 2009.
English translation of NL9100176, published on Mar. 2, 1992.
English translation of NL9100347, published on Mar. 2, 1992.
Kato et al.: "Antenna"; U.S. Appl. No. 11/928,502, filed Oct. 30, 2007.
Kato et al.: "Wireless IC Device"; U.S. Appl. No. 12/211,117, filed Sep. 16, 2008.
Kato et al.: "Antenna"; U.S. Appl. No. 11/688,290, filed Mar. 20, 2007.
Kato et al.: "Electromagnetic-Coupling-Module-Attached Article"; U.S. Appl. No. 11/740,509, filed Apr. 26, 2007.
Kato et al.: "Product Including Power Supply Circuit Board"; U.S. Appl. No. 12/234,949, filed Sep. 22, 2008.
Kato et al.: "Data Coupler"; U.S. Appl. No. 12/252,475, filed Oct. 16, 2008.
Kato et al.; "Information Terminal Device"; U.S. Appl. No. 12/267,666, filed Nov. 10, 2008.
Kato et al.: "Wireless IC Device and Wireless IC Device Composite Component"; U.S. Appl. No. 12/276,444, filed Nov. 24, 2008.
Dokai et al.: "Optical Disc"; U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System"; U.S. Appl. No. 12/274,400, filed Nov. 20, 2008.
Kato: "Wireless IC Device"; U.S. Appl. No. 11/964,185, filed Dec. 26, 2007.
Kato et al.: "Radio Frequency IC Device"; U.S. Appl. No. 12/336,629, filed Dec. 17, 2008.
Kato et al.: "Wireless IC Device and Component for Wireless IC Device"; U.S. Appl. No. 12/339,198, filed Dec. 19, 2008.
Ikemoto et al.: "Wireless IC Device"; U.S. Appl. No. 11/851,651, filed Sep. 7, 2007.
Kataya et al.: "Wireless IC Device and Electronic Device"; U.S. Appl. No. 11/851,661, filed Sep. 7, 2007.
Dokai et al.: "Antenna and Radio IC Device"; U.S. Appl. No. 12/350,307, filed Jan. 8, 2009.
Official communication issued in Japanese Application No. 2007-531524, mailed on Sep. 11, 2007.
Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device"; U.S. Appl. No. 11/624,382, filed Jan. 18, 2007.
Dokai et al.: "Wireless IC Device, and Component for Wireless IC Device"; U.S. Appl. No. 11/930,818, filed Oct. 31, 2007.
Kato et al.: "Wireless IC Device"; U.S. Appl. No. 12/042,399, filed Mar. 5, 2008.
Official communication issued in related U.S. Appl. No. 12/042,399; mailed on Aug. 25, 2008.

* cited by examiner

ANTENNA AND WIRELESS IC DEVICE

BACKGROUND OF THE INVENTION

1. Field of the Invention

The present invention relates to wireless communication apparatuses and, in particular, to antennas and wireless IC devices used in radio frequency identification (RFID) systems.

2. Description of the Related Art

In recent years, as article management systems, RFID systems have been developed in which communication is performed by using a non-contact method in which an electromagnetic field is utilized to transmit predetermined information between a reader/writer, which generates an induction field, and an IC tag (hereafter referred to as a wireless IC device), which is attached to an article and stores predetermined information therein.

A known wireless IC device used in such an RFID system includes a wireless IC chip that processes predetermined radio signals and a radiation electrode pattern that transmits and receives radio signals, and is disclosed, for example, in International Unexamined Publication No. WO2007/083574. International Unexamined Publication No. WO2007/083574 discloses an example of a radiation electrode pattern that includes a patch electrode.

However, there is a problem with radiation electrodes that include a patch electrode in that, for example, it is necessary to provide a feeder pin arranged to feed a signal to the patch electrode inside an insulating board and to provide a feeder electrode on a side surface of the board. The formation of such a feeder portion is difficult, the manufacturing process is complicated, and a poor connection with the radiation electrode occurs at an edge portion of the insulating board.

SUMMARY OF THE INVENTION

To overcome the problems described above, preferred embodiments of the present invention provide an antenna and a wireless IC device that includes the antenna for which the manufacturing process is simple and in which a poor connection occurring between a feeder portion and a radiation electrode is prevented.

An antenna according to a first preferred embodiment of the present invention preferably includes a radiation electrode that is provided on one main surface of an insulator board, a magnetic field electrode that is connected to the radiation electrode, and a feeder portion that is connected to the magnetic field electrode, the radiation electrode being arranged in an area surrounding the magnetic field electrode.

An antenna according to a second preferred embodiment of the present invention preferably includes a radiation electrode that is provided on one main surface of an insulator board, a ground electrode that is arranged on another main surface of the insulator board so as to oppose the radiation electrode, a magnetic field electrode that is connected to the radiation electrode, and a feeder portion that is connected to the magnetic field electrode.

An antenna according to a third preferred embodiment of the present invention preferably includes a radiation electrode that is provided on one main surface of an insulator board, a counter electrode that is arranged on another main surface of the insulator board so as to oppose the radiation electrode and that is coupled with the radiation electrode through a capacitance, a magnetic field electrode that is connected to the radiation electrode, and a feeder portion that is connected to the magnetic field electrode. This antenna may preferably further include a ground electrode that is arranged so as to oppose the counter electrode.

Each of the antennas according to the first, second and third preferred embodiments preferably includes a magnetic field electrode that is disposed between the radiation electrode and the feeder portion and functions as an antenna. With this structure, the feeder pin and side surface electrode, which were necessary in patch antennas of the background art, are no longer necessary, the process of manufacturing the antenna is simplified, and the reliability of a connection between the radiation electrode and the feeder portion is improved.

A wireless IC device according to a fourth preferred embodiment of the present invention preferably includes the antenna and a wireless IC, the wireless IC being arranged so as to be coupled with a feeder portion. With this structure, a wireless IC device can be manufactured that has a small size and for which the manufacturing method is simple.

A wireless IC device according to a fifth preferred embodiment of the present invention preferably includes an antenna, a wireless IC, and an electromagnetic coupling module that is coupled with the wireless IC and is disposed on a feeder circuit board, the feeder circuit board preferably including a feeder circuit that is defined by a resonance circuit and/or a matching circuit that includes an inductance element, and the electromagnetic coupling module being arranged so as to be coupled with a feeder portion. With this structure, impedance matching can be performed between the antenna and the wireless IC in the feeder circuit board, a region that defines a matching circuit between the radiation electrode and the wireless IC that was necessary in the background art can be omitted, and the wireless IC device can be reduced in size.

According to preferred embodiments of the present invention, a radiation electrode and a feeder portion are preferably connected to each other through a magnetic field electrode (magnetic field antenna) and, therefore, a connection portion that has a complex structure and that was necessary in the background art can be omitted, the process of manufacturing the antenna is simplified, and the occurrence of a poor connection between the feeder portion and the radiation electrode is minimized or prevented.

The above and other elements, features, steps, characteristics and advantages of the present invention will become more apparent from the following detailed description of the preferred embodiments with reference to the attached drawings.

BRIEF DESCRIPTION OF DRAWINGS

FIG. 1A is an exploded perspective view and FIG. 1B is a sectional view along line A-A of FIG. 1A.

FIG. 9A is an exploded perspective view and FIG. 9B is a sectional view along line B-B of FIG. 9A.

FIG. 10A is an enlarged view illustrating the arrangement of terminal electrodes of the feeder portion and FIG. 10B is an enlarged view illustrating a state in which a wireless IC chip has been mounted on the feeder portion.

FIG. 12A is an exploded perspective view and FIG. 12B is a sectional view along line C-C of FIG. 12A.

FIG. 16A is a plan view, FIG. 16B is a perspective view of the antenna, and FIG. 16C is a perspective view of a state in which the antenna has been mounted on a metal plate.

FIG. 19A is a perspective view of the antenna and FIG. 19B is an equivalent circuit diagram of a wireless IC device that includes the antenna.

FIG. 20A is a perspective view of the antenna and FIG. 20B is an equivalent circuit diagram of a wireless IC device that includes the antenna.

FIG. 21A is a perspective view of the antenna and FIG. 21B is an equivalent circuit diagram of a wireless IC device that includes the antenna.

DETAILED DESCRIPTION OF THE PREFERRED EMBODIMENTS

Hereafter, antennas and wireless IC devices according to preferred embodiments of the present invention will be described with reference to the accompanying drawings. In each of the drawings, common components and parts are denoted by the same symbols and repeated description thereof is omitted.

First Preferred Embodiment

Figure 1A:
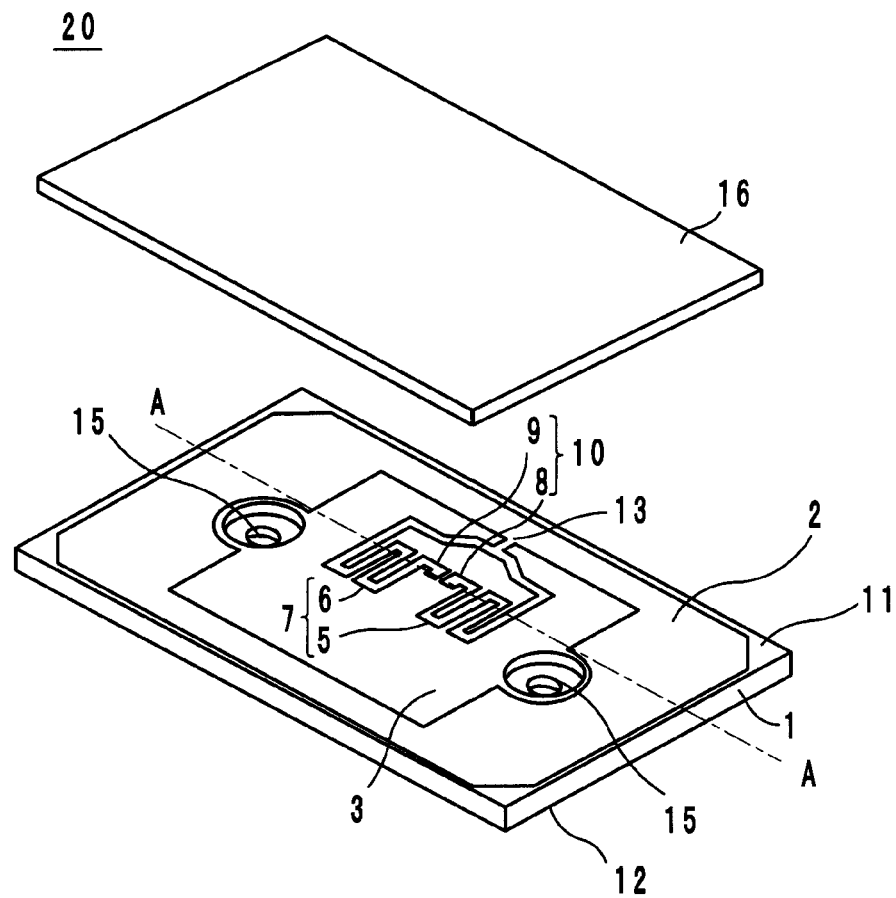
FIGS. 1A and 1B illustrate an antenna according to a first preferred embodiment of the present invention, where
Figure 1B:
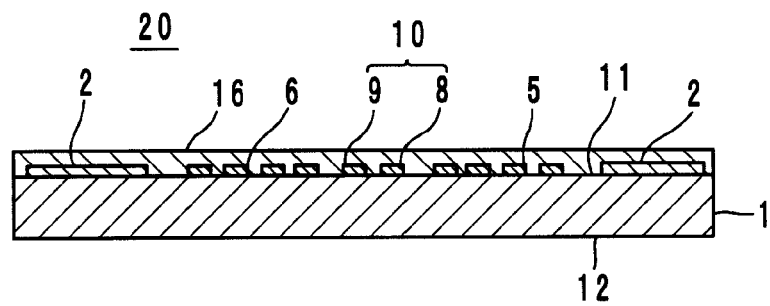

An antenna 20 according to a first preferred embodiment of the present invention is illustrated in FIGS. 1A and 1B. The antenna 20 preferably includes a radiation electrode 2 that is disposed on one main surface 11 of an insulator board and has an opening 3 therein, a magnetic field electrode 7 including a first line-shaped electrode 5 and a second line-shaped electrode 6, which are connected to an inner peripheral portion of the opening 3 of the radiation electrode 2, and a feeder portion 10 formed by arranging an end 8 of the first line-shaped electrode 5 and an end 9 of the second line-shaped electrode 6 so as to face each other. In addition, insulator material 16 is preferably arranged so as to cover the radiation electrode 2 on the one main surface 11 side of the insulator board 1. Furthermore, through holes 15 are preferably screw holes, for example, with which the antenna 20 is screwed onto a predetermined article, such as a metal plate, for example. Instead of being fixed with screws, double-sided tape or an insulating or conductive adhesive may be used to provide the connection.

The radiation electrode 2 functions as the radiation electrode of a patch antenna and is preferably arranged so as to provide wide portions on both sides of the insulator board 1 in the longitudinal direction thereof. The insulator board 1, which is provided with the radiation electrode 2 and the magnetic field electrode 7, can preferably be formed by, for example, etching a metal foil preferably composed of Cu, Al or other suitable material formed on a surface of a resin board, such as a glass epoxy board, for example. The antenna 20 can preferably be formed by applying the insulator material 16, which is, for example, an insulating resin, onto the one main surface 11 on which the radiation electrode 2 has been formed. In addition, the antenna 20 may preferably be formed in an integrated manner by performing injection molding of a resin, such as polyetherimide, for example, onto a metal pattern formed by punching a metal foil composed of Cu, Al or other suitable material. Furthermore, the antenna 20 according to this preferred embodiment preferably has a size of about 68 mm in the longitudinal direction, about 40 mm in the width direction, and a thickness of about 3 mm, for example. The thickness of the insulator material 16 is preferably about 200 µm, for example.

Each of the first line-shaped electrode 5 and the second line-shaped electrode 6 preferably includes a portion having a meandering shape, are connected to each other in the vicinity of the radiation electrode 2, define the magnetic field electrode 7, and are connected to the radiation electrode 2 through a connection portion 13. In addition, the first line-shaped electrode 5 and the second line-shaped electrode 6 are not limited to having a meandering shape and may be modified so as to have any of a variety of suitable shapes so as to obtain desired characteristics.

The operation of the antenna 20 according to the first preferred embodiment will now be described. First, at the time of transmission, when a signal is supplied from the feeder portion 10, a current flows through the first line-shaped electrode 5 and the second line-shaped electrode 6, which define the magnetic field electrode 7, due to this signal. The first line-shaped electrode 5 and the second line-shaped electrode 6 each have a predetermined length and, therefore, a potential difference is generated from the feeder portion 10 to the connection portion 13. When the antenna 20 has been attached to, for example, a metal article (indicated by the symbol 42 in the equivalent circuit of FIG. 4), the metal article 42 is coupled with the radiation electrode 2 through a capacitance C1 and functions as a ground electrode. Furthermore, the magnetic field electrode 7 has a potential difference with the metal article, which functions as a ground electrode, due to the potential difference generated in the first line-shaped electrode 5 and the second line-shaped electrode 6, and the radiation electrode 2, which is conductively connected to the first line-shaped electrode 5 and the second line-shaped electrode 6, also has a potential difference with the metal article. Due to the potential difference between the radiation electrode 2 and the metal article (ground electrode), the radiation electrode 2 operates as a patch antenna and a signal can be radiated from the radiation electrode 2 to the outside.

Furthermore, at the time of reception, a signal transmitted from outside the antenna 20 is received by the magnetic field electrode 7. At this time, a signal is received as a result of the magnetic field electrode 7 becoming coupled with the magnetic field of a signal propagating through space and, thereby, a current is generated in the magnetic field electrode 7 due to this received magnetic field. Due to this current, a potential difference is generated between the connection portion of the first line-shaped electrode 5 and the second line-shaped electrode 6, and the feeder portion 10. Due to this potential difference, similarly to during transmission, the magnetic field electrode 7 has a potential difference with the metal article to which the antenna 20 has been attached. Furthermore, the same potential difference is also generated at the radiation electrode 2, which is conductively connected to the magnetic field electrode 7, and the radiation electrode 2 operates as a patch antenna and a signal can be received from the outside through the radiation electrode 2.

Figure 2:
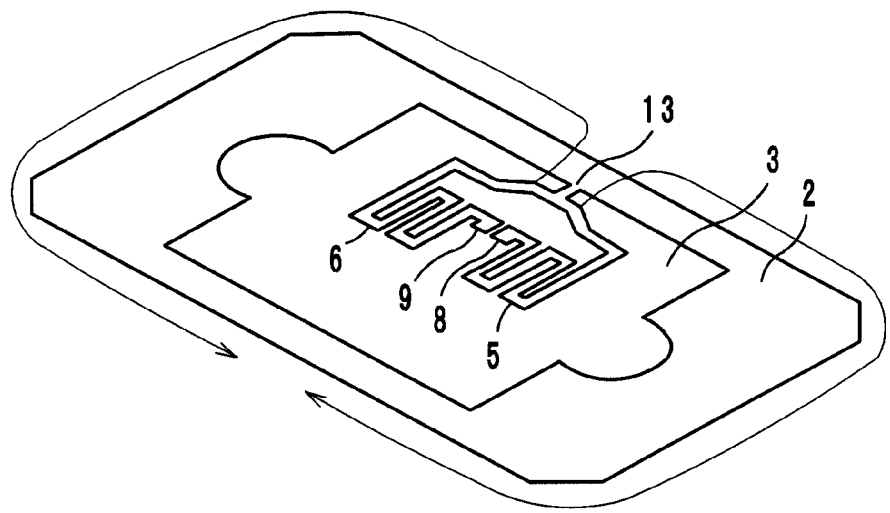
FIG. 2 is a perspective view illustrating operation of the antenna according to the first preferred embodiment of the present invention.

In addition, in the patch antenna of the first preferred embodiment, since the radiation electrode 2 has a closed loop shape, when a signal having a high frequency of several hundred MHz to several GHz is transmitted or received, the current is concentrated in an outer peripheral edge portion of the radiation electrode 2 due to the edge effect as indicated by the arrows in FIG. 2. Accordingly, even when substantially no current flows in the vicinity of the center of the radiation electrode 2 and the opening 3 is provided in the vicinity of the center of the radiation electrode 2, there is substantially no effect on the frequency characteristics of the patch antenna. With this structure, the feeder portion 10 and the magnetic field electrode 7 can preferably be arranged inside the opening 3 and the patch antenna can be reduced in size. Furthermore, as a result of the feeder portion 10 and the radiation electrode 2 being connected to each other through the magnetic field electrode 7, the feeder portion 10 and the radiation electrode 2 can preferably be arranged on the same surface of the insulator board 1. Thus, a feeder pin and an electrode on the side surface of the board, which connect the feeder portion and the radiation electrode and have been necessary to date, are no longer required, the process of manufacturing the antenna is simplified and the reliability of the connection between the feeder portion and the radiation electrode is significantly improved.

Figure 3:
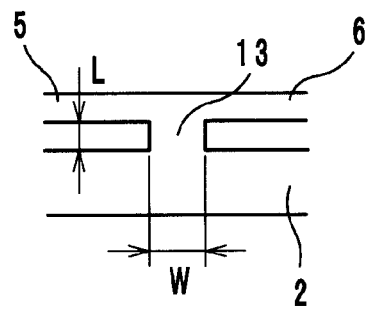
FIG. 3 is an enlarged view illustrating a coupling portion of the antenna according to the first preferred embodiment of the present invention.

In addition, the degree of coupling between the magnetic field electrode 7 and the radiation electrode 2 can be adjusted by changing the width W of the connection portion 13 and the separation L of the magnetic field electrode 7 (line-shaped electrodes 5 and 6) and the radiation electrode 2 illustrated in FIG. 3. As the width W of the connection portion and the separation L increases, the degree of coupling decreases, and as the width W of the connection portion 13 and the separation L decreases, the degree of coupling increases.

Figure 4:
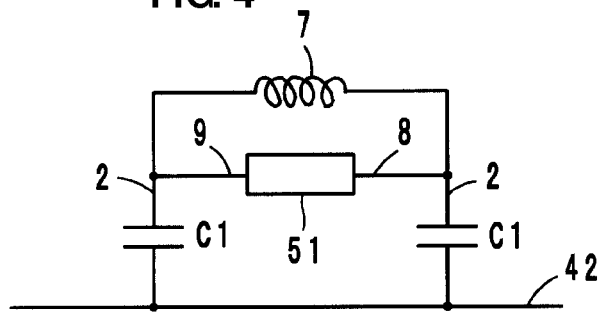
FIG. 4 is an equivalent circuit diagram of a wireless IC device that includes the antenna according to the first preferred embodiment of the present invention.

An equivalent circuit of the antenna 20 is illustrated in FIG. 4. In FIG. 4, an equivalent circuit is illustrated of a wireless IC device in which a wireless IC chip 51 (refer to FIG. 11), to be described below, is connected to the feeder portion 10 defined by the ends 8 and 9. In addition, in the antenna 20, a ground electrode (metal article 42) arranged so as to oppose the radiation electrode 2 is not necessarily required. Even when a ground electrode (metal article 42) is not provided, the radiation electrode 2 operates as an antenna (loop antenna or folded dipole antenna) due to the potential difference generated in the magnetic field electrode 7.

Second Preferred Embodiment

Figure 5:
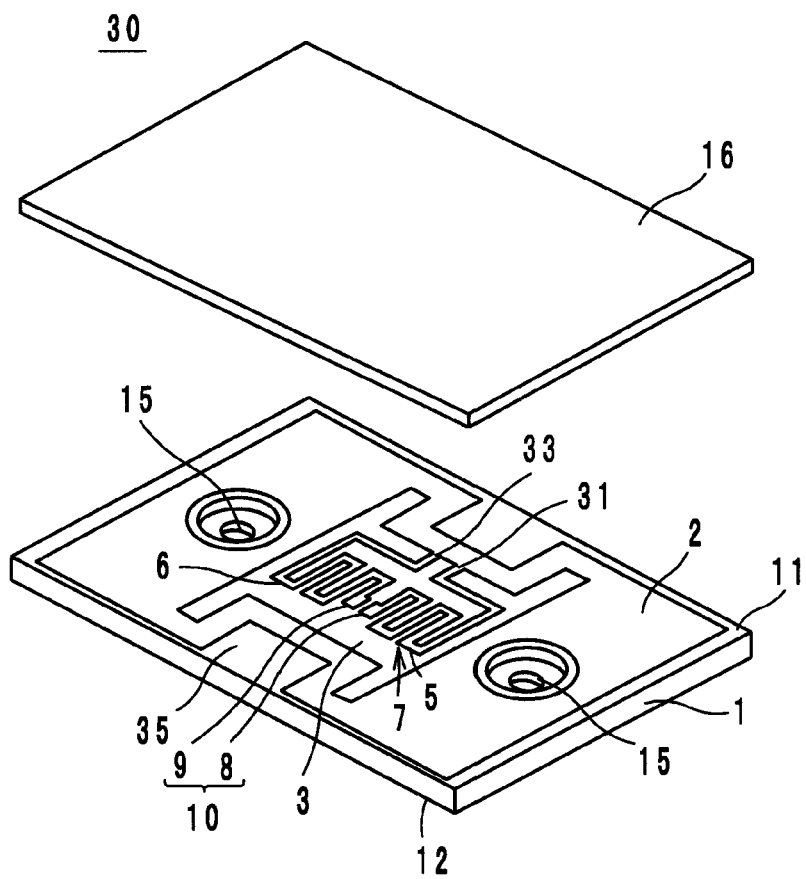
FIG. 5 is an exploded perspective view illustrating an antenna according to a second preferred embodiment of the present invention.
Figure 6:
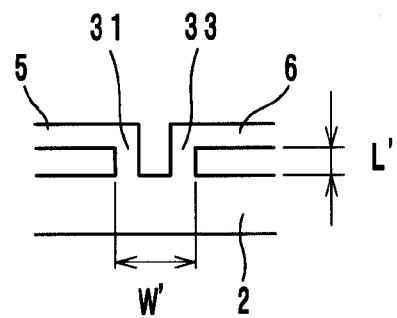
FIG. 6 is an enlarged view illustrating a coupling portion of the antenna according to the second preferred embodiment of the present invention.

An antenna 30 according to a second preferred embodiment of the present invention is illustrated in FIG. 5. The antenna 30 differs from the antenna 20 according to the first preferred embodiment in that the structure of the connection portion 13 and the shape of the radiation electrode 2 are different and in that a first connection portion 31 and a second connection portion 33 preferably are provided. In the antenna 30, the magnetic field electrode 7 is preferably defined by the first line-shaped electrode 5 and the second line-shaped electrode 6. By arranging the connection portions 31 and 33 of the magnetic field electrode 7 and the radiation electrode 2 so as to be separated from each other, as in the second preferred embodiment, the degree of coupling between the magnetic field electrode 7 and the radiation electrode 2 can be precisely adjusted. The degree of coupling between the magnetic field electrode 7 and the radiation electrode 2 is increased as a width W' is increased and is decreased as a separation L' becomes is increased, as illustrated in FIG. 6.

Furthermore, in the antenna 30, portions of the radiation electrode 2 in the vicinity of the center of the radiation electrode 2 in the longitudinal direction preferably protrude toward the opening 3 and concave portions 35 are preferably provided. The size of the antenna 30 can be reduced by changing the shape of the portions of the radiation electrode 2 in this manner, while the length of the radiation electrode 2 in the longitudinal direction remains substantially fixed. The antenna 30 according to the second preferred embodiment preferably has a size of about 60 mm in the longitudinal direction, about 40 mm in the width direction, and a thickness of about 3 mm, for example.

Third Preferred Embodiment

Figure 7:
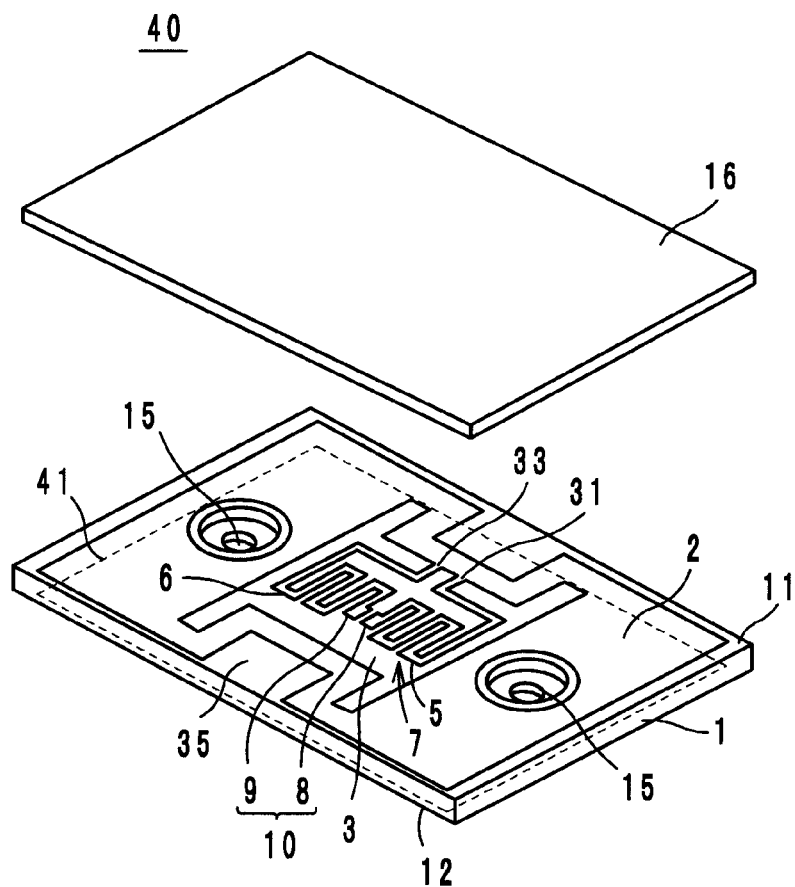
FIG. 7 is an exploded perspective view illustrating an antenna according to a third preferred embodiment of the present invention.

An antenna 40 according to a third preferred embodiment of the present invention is illustrated in FIG. 7. The antenna 40 differs from that of the second preferred embodiment in that a ground electrode 41 is arranged on another main surface 12 of the insulator board 1 and the remaining structure thereof is substantially the same as that of the second preferred embodiment.

In the first preferred embodiment and the second preferred embodiment, the radiation electrode 2 operates as an antenna due to the potential difference that is generated between the radiation electrode 2 and the metal article to which the antenna 20 or 30 is attached. The metal article functions as a ground electrode for the radiation electrode 2 and, since the radiation electrode 2 and the ground electrode are arranged so as to be insulated from each other, a capacitance (C1, refer to FIG. 4) is generated therebetween. This capacitance affects the frequency of transmission/reception signals that can be transmitted and received by the antenna. That is, there is a problem in that, if the capacitance between the radiation electrode 2 and the ground electrode fluctuates, the frequency of signals that can be transmitted and received by the antenna also fluctuates and communication becomes unstable. Furthermore, examples of causes of the changes to the capacitance between the radiation electrode 2 and the metal article functioning as a ground electrode include variations in the thickness of the adhesive used to connect the insulator board 1 to the metal article and there being a gap between the insulator board 1 and the metal article created when adhering the insulator board 1 to the metal article.

In order to solve this problem, in the antenna 40 according to the third preferred embodiment, the ground electrode 41 is arranged on the other main surface 12 of the insulator board 1. With this structure, as illustrated in the equivalent circuit in FIG. 8, a capacitance C2 between the radiation electrode 2 and the ground electrode 41 in the thickness direction of the insulator board 1 can be determined and fluctuations of the frequency of signals that can be transmitted and received by the antenna 40 are effectively prevented by preventing fluctuations of this capacitance. In addition, in the case where a back surface electrode provided on a glass epoxy board or other suitable board formed by injection molding of a resin is preferably used for the ground electrode, as in the first preferred embodiment, the metal foil used for the ground electrode can be formed by being simultaneously arranged separate from the metal foil of the radiation electrode 2.

Figure 8:
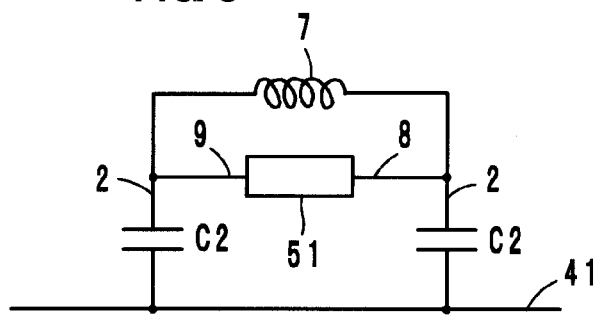
FIG. 8 is an equivalent circuit diagram of a wireless IC device that includes the antenna according to the third preferred embodiment of the present invention.

The equivalent circuit illustrated in FIG. 8, similar to FIG. 4, is an equivalent circuit of a wireless IC device in which the wireless IC chip 51 (refer to FIG. 11), which will be described below, is preferably connected to the feeder portion 10 defined by ends 8 and 9.

Fourth Preferred Embodiment

Figure 9A:
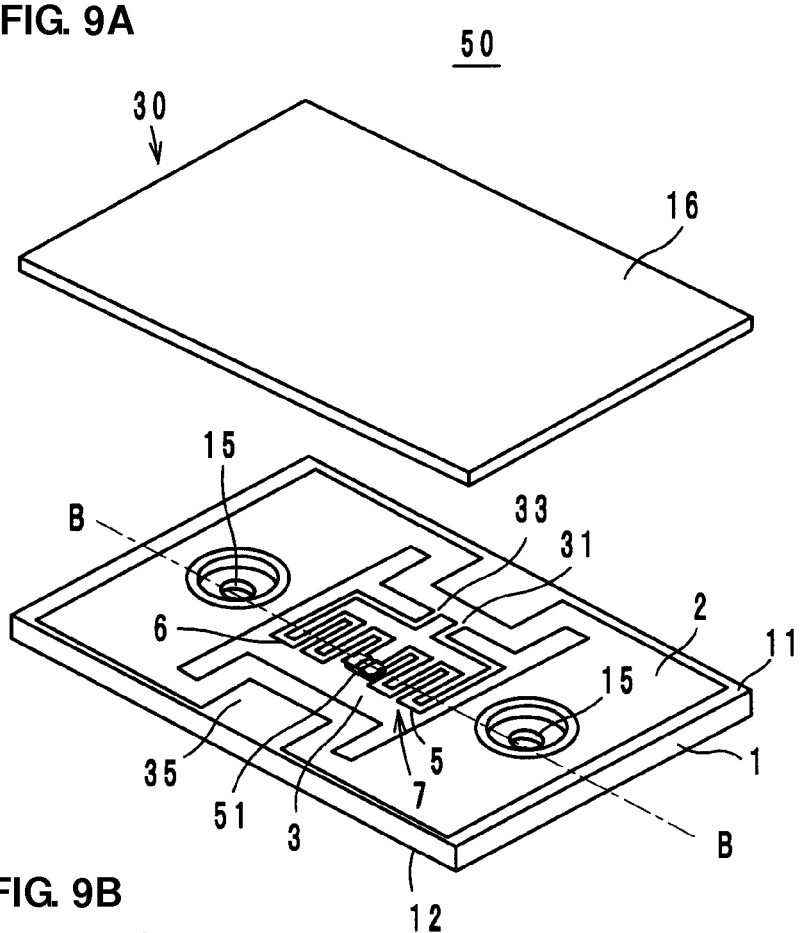
FIGS. 9A and 9B illustrate a wireless IC device according to a fourth preferred embodiment of the present invention, where
Figure 9B:
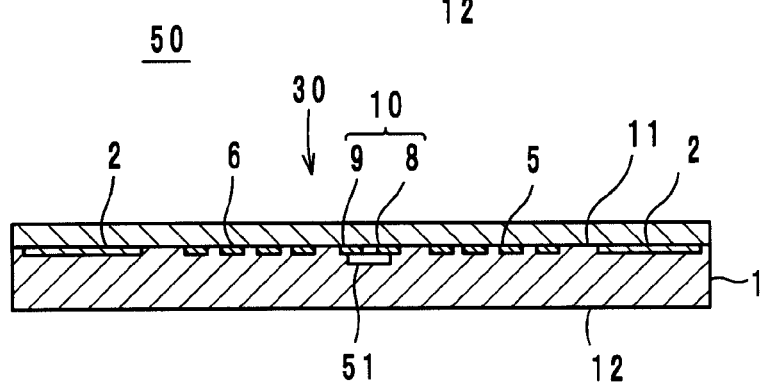
Figure 10A:
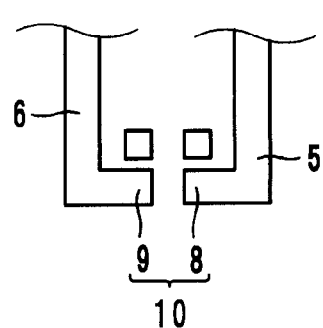
FIGS. 10A and 10B illustrate a feeder portion of the wireless IC device according to the fourth preferred embodiment of the present invention, where
Figure 10B:
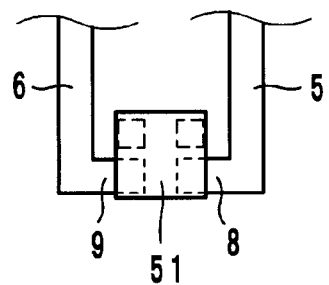
Figure 11:
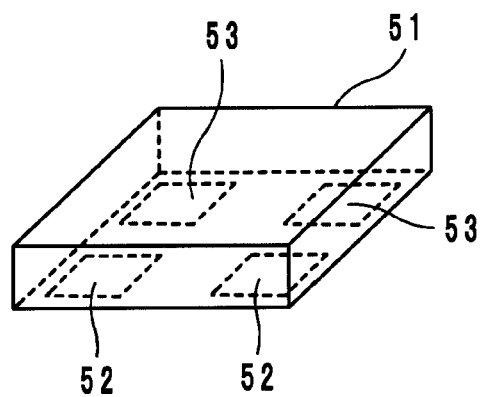
FIG. 11 is a perspective view of the wireless IC chip that is included in the wireless IC device according to the fourth preferred embodiment of the present invention.

FIGS. 9A and 9B illustrate a wireless IC device 50 according to a fourth preferred embodiment of the present invention, the wireless IC device 50 preferably including the antenna 30. In the wireless IC device 50, the wireless IC chip 51 is arranged on the feeder portion 10. The wireless IC chip 51 preferably includes a clock circuit, a logic circuit, a memory circuit and other suitable circuits and stores necessary information therein. The wireless IC chip 51 is preferably provided with input/output terminal electrodes 52 and 52 and mounting terminal electrodes 53 and 53 on the back surface thereof, as illustrated in FIG. 11. The input/output terminal electrodes 52 and 52 are preferably electrically connected to the feeder portion 10 defined by the ends 8 and 9 of the line-shaped electrodes 5 and 6 through metal bumps, for example. In addition, Au, solder, or other suitable material, for example, can preferably be used as the material of the metal bumps.

The operation of the wireless IC device 50 according to the fourth preferred embodiment will now be described. A transmission signal, which has a predetermined frequency and originates from the wireless IC chip 51, is transmitted to outside the wireless IC device 50 through the magnetic field electrode 7 and the radiation electrode 2. Furthermore, a signal is received from a reader/writer, which is not illustrated, through the magnetic field electrode 7 and the radiation electrode 2 and is supplied to the wireless IC chip 51. Accordingly, in the wireless IC device 50, the wireless IC chip operates due to the signal received by the magnetic field electrode 7 and the radiation electrode 2 and a response signal from the wireless IC chip 51 is radiated to the outside from the magnetic field electrode 7 and the radiation electrode 2.

In order to perform impedance matching between the wireless IC chip 51, and the magnetic field electrode 7 and the radiation electrode 2, an impedance-matching circuit may preferably be provided between the feeder portion 10 and the magnetic field electrode 7. Furthermore, when the wireless IC device 50 is manufactured by injection molding of a resin, for example, the wireless IC chip 51 is preferably arranged at the approximate center of the wireless IC device 50 in the thickness direction and, as a result, the wireless IC chip 51 can be prevented from being damaged when the wireless IC device 50 is subject to an impact or when a mechanical stress is applied to the wireless IC device 50 due to bending or other force.

Fifth Preferred Embodiment

Figure 12A:
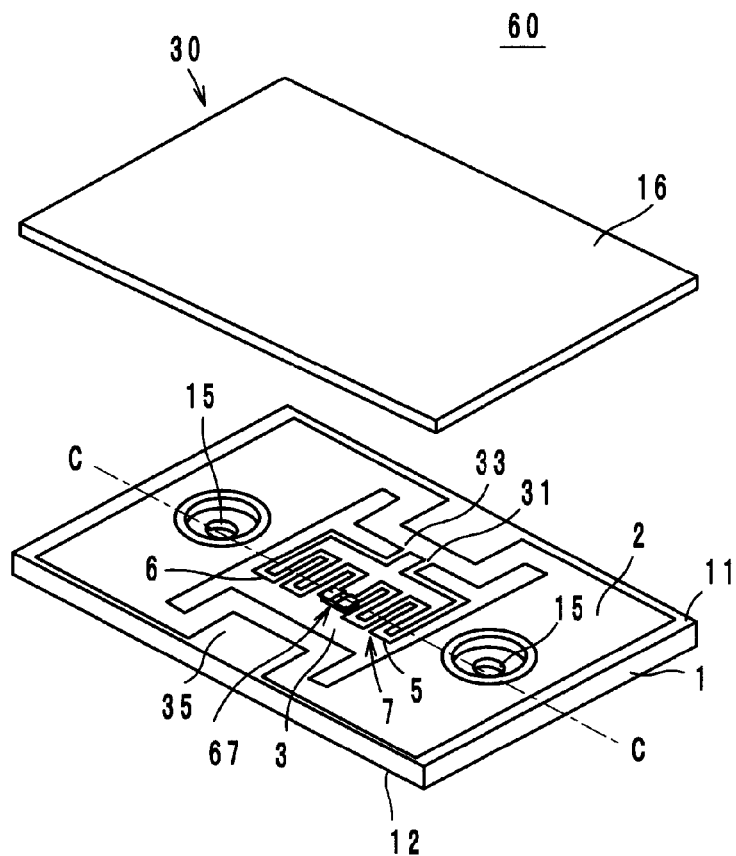
FIGS. 12A and 12B illustrate a wireless IC device according to a fifth preferred embodiment of the present invention, where
Figure 12B:
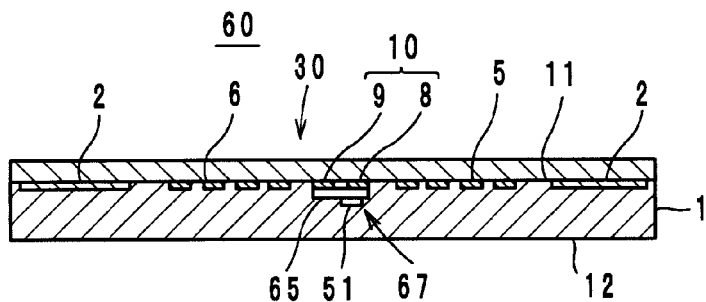

FIGS. 12A and 12B illustrates a wireless IC device 60 according to a fifth preferred embodiment of the present invention, the wireless IC device 60 includes the antenna 30. The wireless IC device 60 preferably includes the wireless IC chip 51, an electromagnetic coupling module 67 including a feeder circuit board 65 on which the wireless IC chip 51 is mounted, the magnetic field electrode 7, and the radiation electrode 2.

Figure 13:
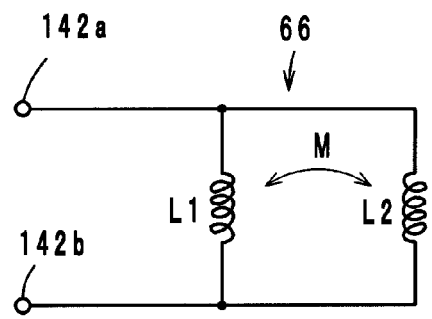
FIG. 13 is an equivalent circuit diagram illustrating a feeder circuit of the wireless IC device according to the fifth preferred embodiment of the present invention.

The fifth preferred embodiment differs from the fourth preferred embodiment in that the feeder circuit board 65 is provided. The feeder circuit board 65 preferably includes a feeder circuit 66 (described in detail below with reference to FIG. 15) including a matching circuit, which includes inductance elements L1 and L2 having different inductance values and being inversely magnetically coupled (represented by mutual inductance M), as illustrated by the equivalent circuit in FIG. 13. The feeder circuit 66 attempts to match the impedance of the wireless IC chip 51 and the impedance of the magnetic field electrode 7 and the radiation electrode 2.

Therefore, the feeder circuit 66 transfers a transmission signal having a predetermined frequency and originating from the wireless IC chip 51 to the radiation electrode 2 through the magnetic field electrode 7, and supplies a signal received by the radiation electrode 2 and the magnetic field electrode 7 to the wireless IC chip 51. Accordingly, in the wireless IC device 60, the wireless IC chip 51 operates due to the signal received by the radiation electrode 2 and the magnetic field electrode 7 and a response signal from the wireless IC chip 51 is radiated to the outside from the magnetic field electrode 7 and the radiation electrode 2.

Figure 14:
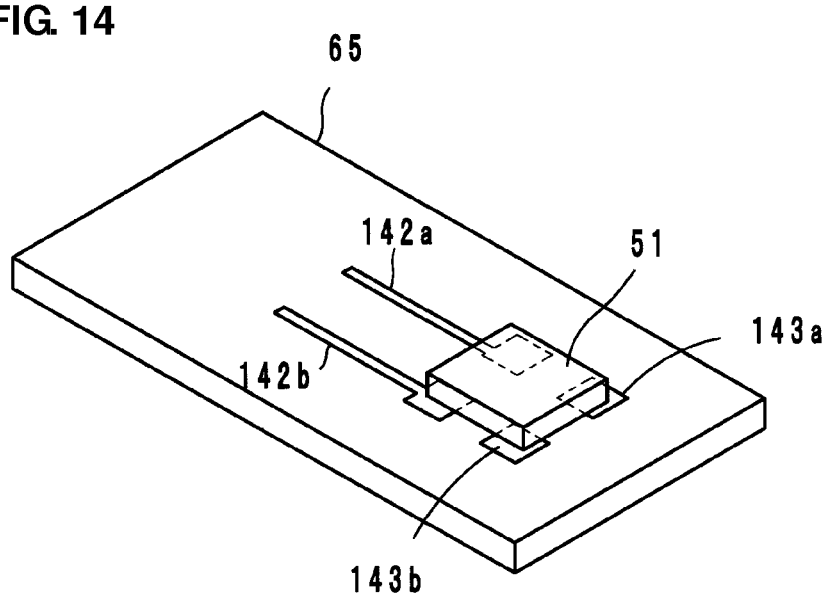
FIG. 14 is a perspective view illustrating a state in which a wireless IC chip has been mounted on a feeder circuit board, the feeder circuit board being included in the wireless IC device according to the fifth preferred embodiment of the present invention.

Next, the structure of the feeder circuit board 65 will be described with reference to FIG. 14 and FIG. 15. As illustrated in FIG. 14, preferably, the input/output terminal electrodes of the wireless IC chip 51 are connected to feeder terminal electrodes 142a and 142b provided on the feeder circuit board 65 and the mounting terminal electrodes of the wireless IC chip 51 are connected to mounting terminal electrodes 143a and 143b through metal bumps, for example.

Figure 15:
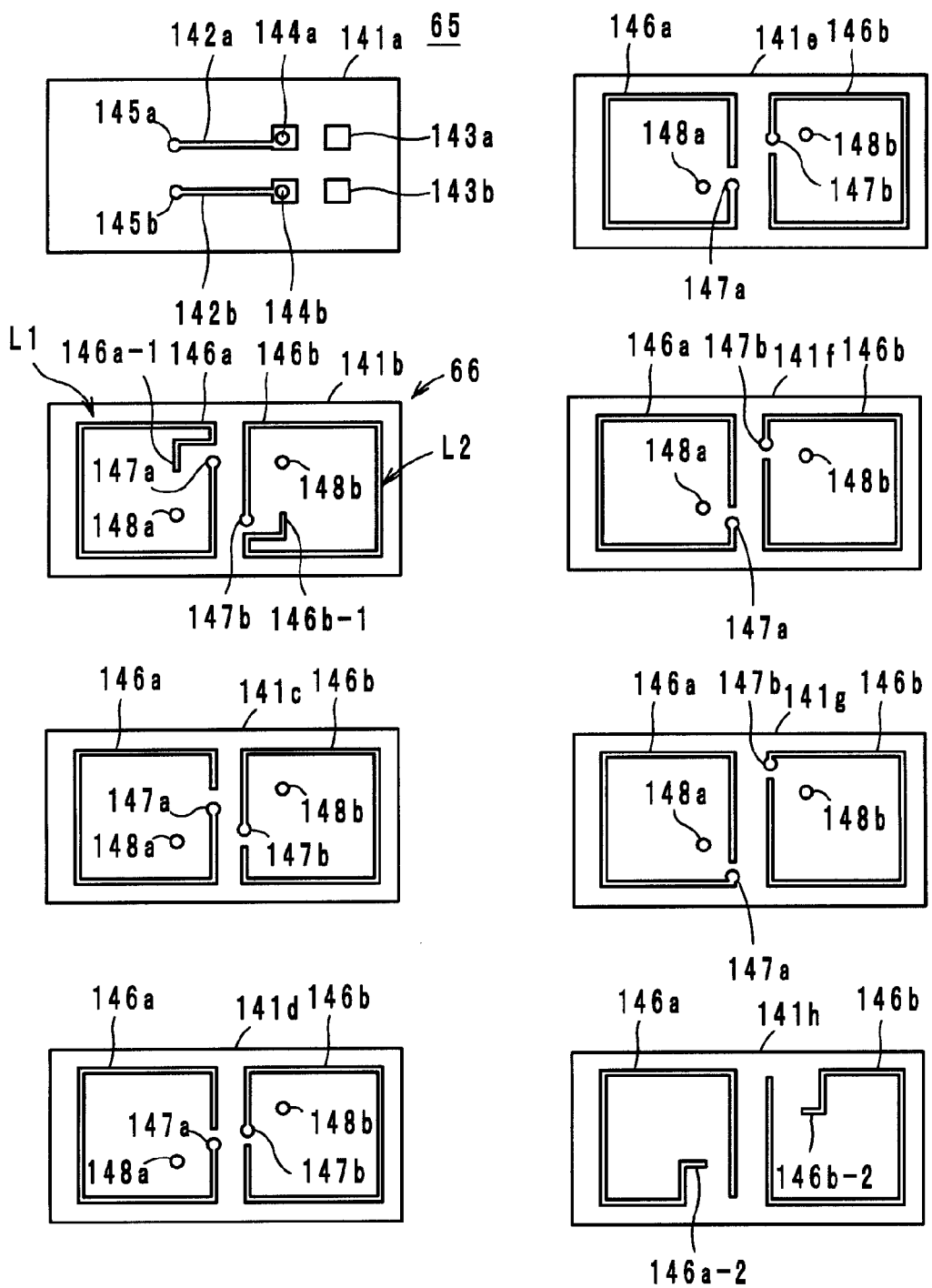
FIG. 15 is a plan view illustrating the layered structure of the feeder circuit board included in the wireless IC device according to the fifth preferred embodiment of the present invention of the present invention.

As illustrated in FIG. 15, the feeder circuit board 65 is formed by stacking on top of one another, pressure bonding together and baking ceramic sheets 141a to 141h, which are preferably made of a dielectric or magnetic material, for example. However, the insulating layers of the feeder circuit board 65 are not limited to being ceramic sheets, and, for example, may be sheets made of a resin, such as a thermosetting resin or a thermoplastic resin such as a liquid crystal polymer. The feeder terminal electrodes 142a and 142b, the mounting terminal electrodes 143a and 143b, and via hole conductors 144a, 144b, 145a and 145b are preferably formed on and through the uppermost sheet 141a. Wiring electrodes 146a and 146b, which respectively define the inductance elements L1 and L2, and via hole conductors 147a, 147b, 148a and 148b are preferably formed on and though the second to eighth sheets 141b to 141h, as necessary.

By stacking the sheets 141a to 141h on top of one another, the inductance element L1, in which the wiring electrodes 146a are connected to one another in a helical shape by the via hole conductors 147a, is formed and the inductance element L2, in which the wiring electrodes 146b are connected to one another in a helical shape by the via hole conductors 147b, is formed. In addition, capacitances are formed between wires of the wiring electrodes 146a and 146b.

An end portion 146a-1 of the wiring electrode 146a on the sheet 141b is connected to the feeder terminal electrode 142a through the via hole conductor 145a and an end portion 146a-2 of the wiring electrode 146a on the sheet 141h is connected to the feeder terminal electrode 142b through the via hole conductors 148a and 145b. An end portion 146b-1 of the wiring electrode 146b on the sheet 141b is connected to the feeder terminal electrode 142b through the via hole conductor 144b and an end portion 146b-2 of the wiring electrode 146b on the sheet 141h is connected to the feeder terminal electrode 142a through the via hole conductors 148b and 144a.

In the above-described feeder circuit 66, the inductance elements L1 and L2 are preferably wound in opposite directions to each other and, therefore, the magnetic fields generated by the inductance elements L1 and L2 cancel each other out. Since the magnetic fields cancel each other out, it is necessary that the wiring electrodes 146a and 146b have a certain length in order to obtain the desired inductance values. Thus, the Q value is reduced and, therefore, the resonance characteristic is relatively flat and the band is widened in the vicinity of the resonant frequency.

The inductance elements L1 and L2 are formed at different positions in the left-right direction when the feeder circuit board 65 is viewed in plan. In addition, the magnetic fields generated by the inductance elements L1 and L2 are in opposite directions to each other. Thus, when the feeder circuit is coupled with the feeder portion 10 defined by the line-shaped electrodes 5 and 6, a current can be generated in the magnetic field electrode 7 due to currents being excited in opposite directions in the line-shaped electrodes 5 and 6, and the radiation electrode 2 operates as a patch antenna due to the potential difference caused by this current. By including a matching circuit in the feeder circuit board 65, as in the fifth preferred embodiment, a space for a matching circuit which previously had to be provided separately on the insulator board 1 can be omitted and a reduction in the size of the wireless IC device can be achieved due to the reduction in size of the antenna. Furthermore, since the matching circuit is built into the board 65, fluctuations in the characteristics of the matching circuit due to the influence of external articles are prevented and deterioration of communication quality is prevented. In addition, in the fifth preferred embodiment, the wireless IC chip 51 of the electromagnetic coupling module 67 is preferably arranged at the approximate center of the wireless IC device 60 in the thickness direction and, thereby, the wireless IC chip 51 is protected from being damaged and the mechanical strength of the wireless IC device is improved.

With the structure of the wireless IC device 60 illustrated in FIGS. 12A and 12B, an RFID was manufactured that had a communication frequency of about 950 MHz, and when this RFID was arranged on an Al metal plate and the radiation characteristics thereof were investigated, a radiation gain of about −0.6 MHz was obtained at about 950 MHz. Furthermore, in this experiment, the distance from the Al metal plate to the radiation electrode 2 was about 3 mm and the radiation characteristic was improved to about +1 dB by increasing this distance be about 4 mm, for example.

Sixth Preferred Embodiment

Figure 16A:
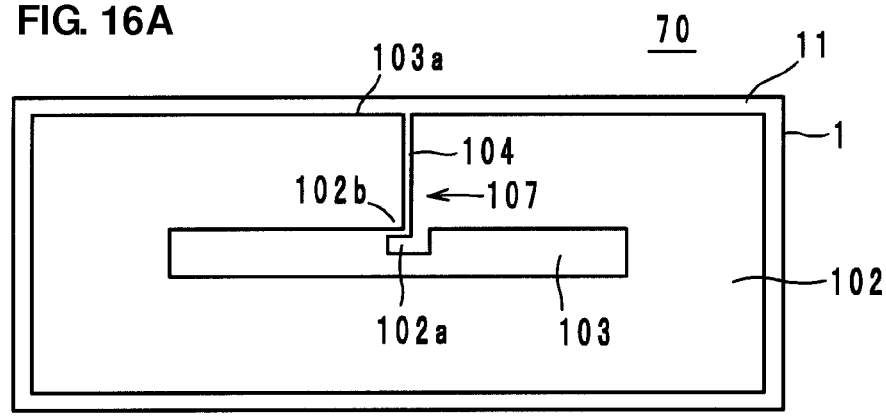
FIGS. 16A to 16C illustrate an antenna according to a sixth preferred embodiment of the present invention, where
Figure 16B:
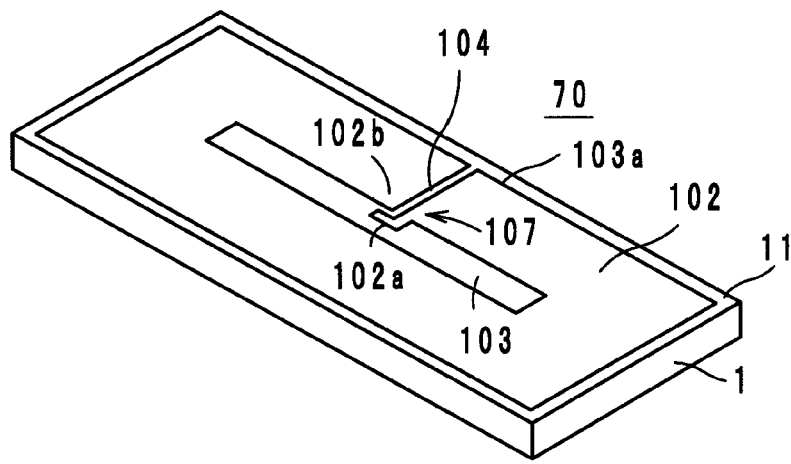
Figure 16C:
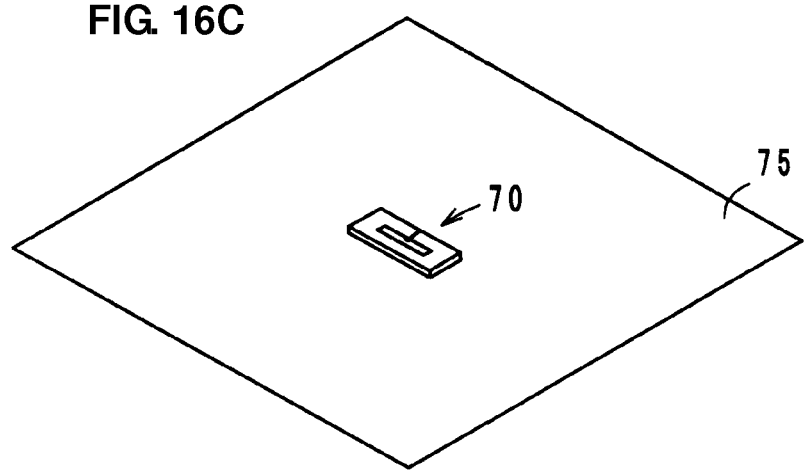

An antenna 70 according to a sixth preferred embodiment of the present invention is illustrated in FIGS. 16A to 16C. In the antenna 70, an opening 103 and a slit 104 are preferably provided in a radiation electrode 102 provided on the one main surface 11 of the insulator board 1, the slit 104 extending from the opening 103 to an edge portion 103a of the radiation electrode 102. One end portion 102a that projects into the opening 103 opposes another end portion 102b and the one end portion 102a and the other end portion 102b preferably define a feeder portion. In the sixth preferred embodiment, a magnetic field electrode 107 is provided in an area surrounding the opening 103, which includes the one end portion 102a and the other end portion 102b. That is, in the sixth preferred embodiment, in contrast to the first to fifth preferred embodiments, the radiation electrode 102 has a loop shape that is opened by the slit 104, and therefore, a current is concentrated in an inner peripheral edge portion (area surrounding the opening 103) of the radiation electrode 102. This inner peripheral edge portion functions as the magnetic field electrode 107. In this case (similarly to the following preferred embodiments and modifications), the radiation electrode and the magnetic field electrode are formed in an integrated manner.

In the sixth preferred embodiment, a signal is transferred to the magnetic field electrode 107 from the feeder portion and the signal is then radiated to the outside from the radiation electrode 102, which is integrated with the magnetic field electrode 107. In this manner, since the magnetic field electrode 107 and the radiation electrode 102 are integrated with each other, a signal can be transmitted to the outside from the feeder portion with the characteristics thereof (for example, wide-band frequency characteristics) remaining substantially unchanged. This is also the case when a signal is received.

As illustrated in FIG. 16C, the antenna 70 is preferably arranged on a metal plate 75, the metal plate 75 functions as a ground electrode, the radiation electrode 102 functions as a patch antenna, and communication is performed. The operation and operational advantages of the antenna 70 are substantially the same as those of the first preferred embodiment. In particular, the slit 104 is preferably provided in the radiation electrode 102 and thereby the radiation electrode 102 and the magnetic field electrode 107 can be formed in an integrated manner and an antenna is obtained that has a very simple structure. In addition, the metal plate 75 is not necessarily required, as in the first preferred embodiment.

Seventh Preferred Embodiment

Figure 17:
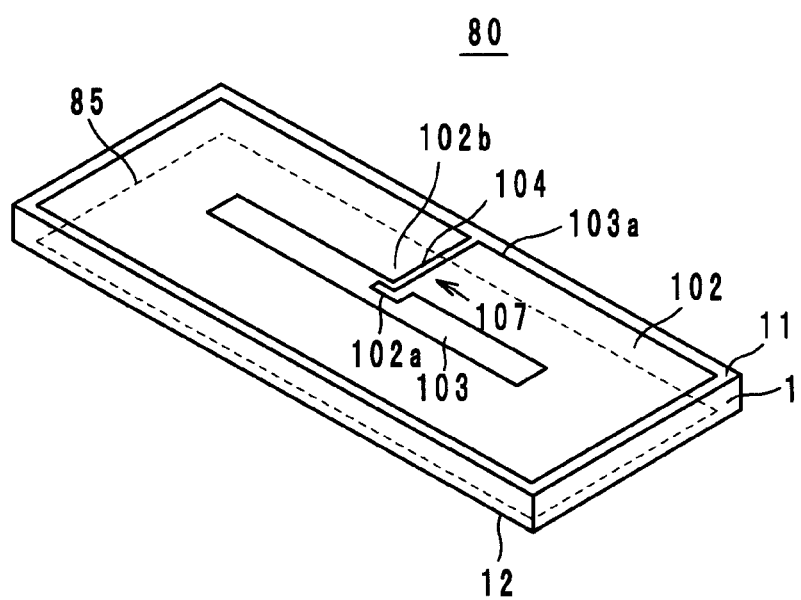
FIG. 17 is a perspective view illustrating an antenna according to a seventh preferred embodiment of the present invention.
Figure 18A:
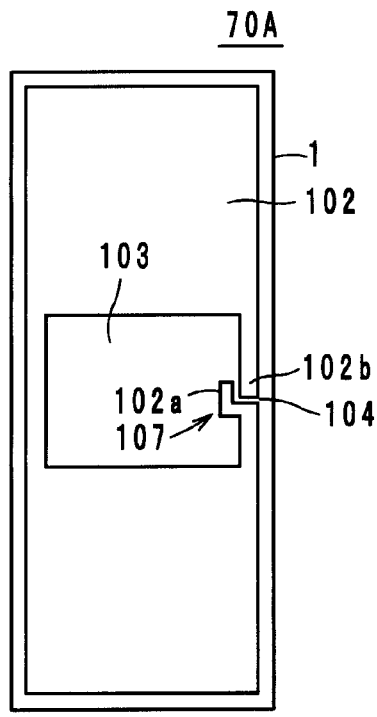
FIGS. 18A to 18D are plan views illustrating first, second, third and fourth modifications of the sixth preferred embodiment of the present invention.
Figure 18B:
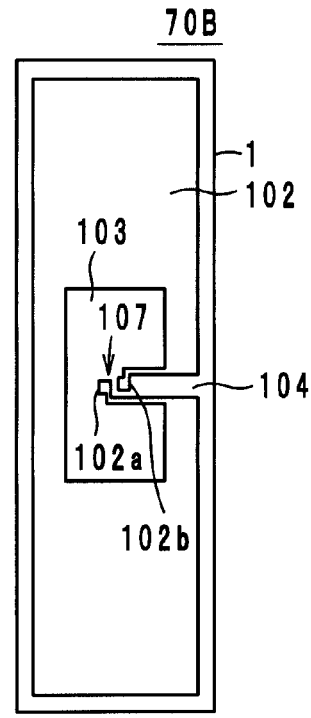
Figure 18C:
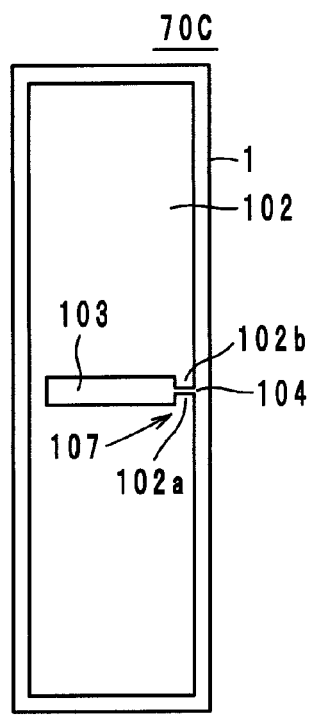
Figure 18D:
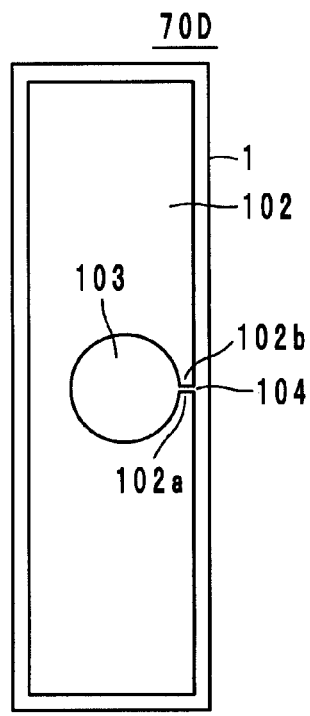

An antenna 80 according to a seventh preferred embodiment of the present invention is illustrated in FIG. 17. The antenna 80 differs from that of the sixth preferred embodiment in that a ground electrode 85 is arranged on the other main surface 12 of the insulator board 1 and the remainder of the structure thereof is substantially the same as that of the sixth preferred embodiment. The operational advantage of providing the ground electrode 85 was described in the third preferred embodiment.

Modifications of Sixth Preferred Embodiment

First, second, third and fourth modifications of the sixth preferred embodiment are illustrated in FIGS. 18A to 18D. In the first modification (antenna 70A) illustrated in FIG. 18A, preferably, the opening 103 of the radiation electrode 102 has a comparatively large area and the one end portion 102a and the other end portion 102b are arranged in an edge portion of the radiation electrode 102. In the second modification (antenna 70B) illustrated in FIG. 18B, preferably, the one end portion 102a and the other end portion 102b, which define the magnetic field electrode 107, are arranged so as to protrude into the opening 103. In the third modification (antenna 70C) illustrated in FIG. 18C, preferably, the one end portion 102a and the other end portion 102b, which define the magnetic field electrode 107, oppose each other with the slit 104 therebetween. In the fourth modification (antenna 70D) illustrated in FIG. 18D, the opening 103 preferably has a circular shape, for example, but may instead have an elliptical shape.

The operation and operational advantages of the antennas 70A to 70D described in the first to fourth modifications are substantially the same as those of the sixth preferred embodiment. In particular, by arranging components of the feeder portion (102a and 102b) so as to face each other in the width direction of the insulator board 1, as in the antennas 70A and 70B, the wireless IC chip or electromagnetic coupling module (feeder circuit board) mounted on the feeder portion can be securely fixed in place. That is, the rectangular insulator board 1 readily bends in the longitudinal direction but does not readily bend in the width direction. Even when the insulator board 1 is bent in the longitudinal direction, the wireless IC chip or the feeder circuit board is coupled to the feeder portion in the width direction and, therefore, is unlikely to be disconnected from the feeder portion so as to significantly improve reliability. These advantages are similarly provided by the sixth and seventh preferred embodiments.

Eighth Preferred Embodiment

Figure 19A:
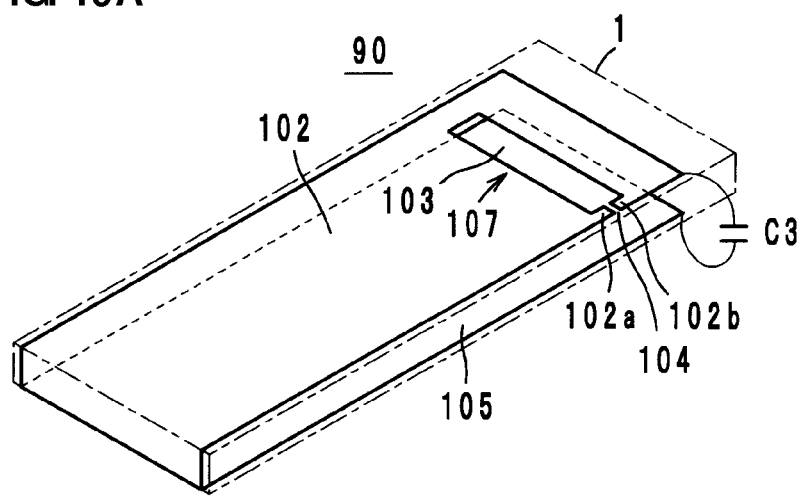
FIGS. 19A and 19B illustrate an antenna according to an eighth preferred embodiment of the present invention, where

An antenna 90 according to an eighth preferred embodiment of the present invention is illustrated in FIG. 19A. In the antenna 90, a conductor is preferably arranged so as to extend in the longitudinal direction from the front surface of the insulator board 1 to the back surface thereof via an edge surface. Preferably, in the front surface portion of this conductor, functioning as the radiation electrode 102, the opening 103 is provided, which includes the one end portion 102a and the other end portion 102b, and the magnetic field electrode 107 is provided in an area surrounding the opening 103. The back surface portion of the conductor functions as a counter electrode 105 and the counter electrode 105 is coupled with the radiation electrode 102 through the capacitance C3 of an end portion thereof. Furthermore, an inductance L5 shown in FIG. 19B is formed in a portion that directly connects the ends of the radiation electrode 102 and the counter electrode 105.

In the eighth preferred embodiment, a potential difference generated in the magnetic field electrode 107 is transferred to the radiation electrode 102 and the radiation electrode 102 operates as a patch antenna due to the potential difference between the radiation electrode 102 and the counter electrode 105. The capacitance C3 formed between the radiation electrode 102 and the counter electrode 105 is comparatively small and the frequency of signals that can be transmitted and received are determined by this capacitance C3.

Figure 19B:
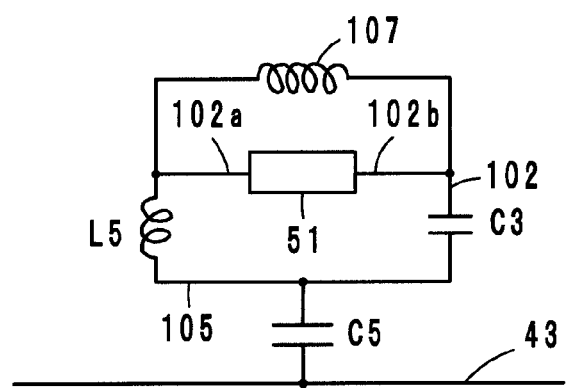

In addition, as illustrated in FIG. 19B, a ground electrode (metal article) 43 may preferably be arranged so as to oppose the counter electrode 105 on the back surface side of the antenna 90. The counter electrode 105 and the ground electrode are preferably coupled with each other through a comparatively large capacitance C5 and the ground electrode 43 is excited through the counter electrode 105. In addition, the capacitance C5 may be infinitely large, that is to say, the ground electrode 43 may be in direct conductive contact with the counter electrode 105.

Ninth Preferred Embodiment

Figure 20A:
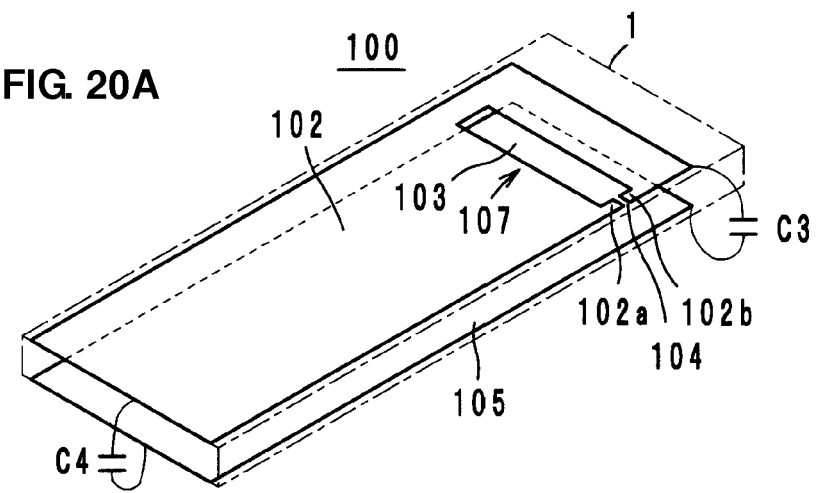
FIGS. 20A and 20B illustrate an antenna according to a ninth preferred embodiment of the present invention, where

An antenna 100 according to a ninth preferred embodiment of the present invention is illustrated in FIG. 20A. In the antenna 100, preferably, the counter electrode 105 and the radiation electrode 102 of the antenna 90 according to the eighth preferred embodiment are isolated from each other and the radiation electrode 102 and the counter electrode 105 are coupled with each other through capacitances C3 and C4 formed at end portions thereof. The remainder of the structure is substantially the same as that of the antenna 90.

Also in the ninth preferred embodiment, a potential difference generated in the magnetic field electrode 107 is transferred to the radiation electrode 102 and the radiation electrode 102 operates as a patch antenna due to the potential difference between the radiation electrode 102 and the counter electrode 105. The capacitances C3 and C4 formed between the radiation electrode 102 and the counter electrode 105 are comparatively small and the frequencies at which transmission and reception can be performed are determined by these capacitances C3 and C4.

Figure 20B:
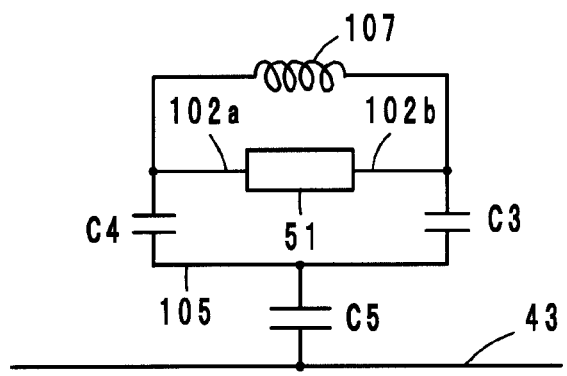

Furthermore, as illustrated in FIG. 20B, preferably, the ground electrode (metal article) 43 may be arranged so as to oppose the counter electrode 105 on the back surface side of the antenna 100 and the two electrodes may be coupled with each other through the capacitance C5 or may be in direct conductive contact with each other.

Tenth Preferred Embodiment

Figure 21A:
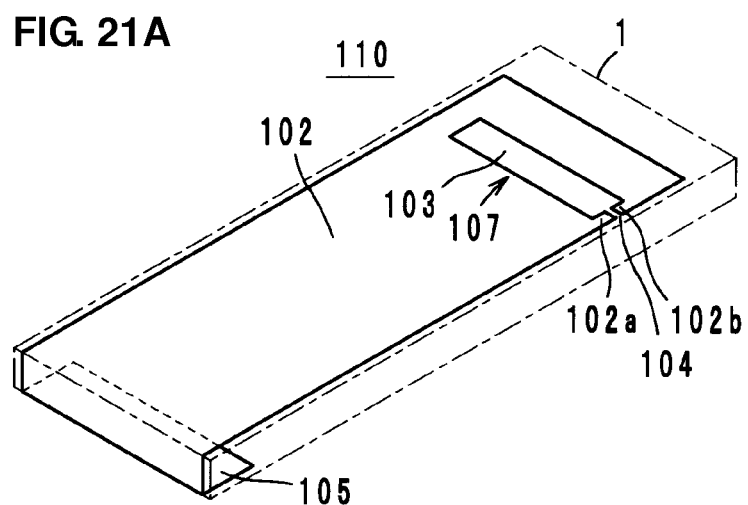
FIGS. 21A and 21B illustrate an antenna according to a tenth preferred embodiment of the present invention, where

An antenna 110 according to a tenth preferred embodiment of the present invention is illustrated in FIG. 21A. In the antenna 110, the counter electrode 105 of the antenna 90 according to the eighth preferred embodiment is preferably reduced in length. The remainder of the structure is substantially the same as that of the antenna 90.

Figure 21B:
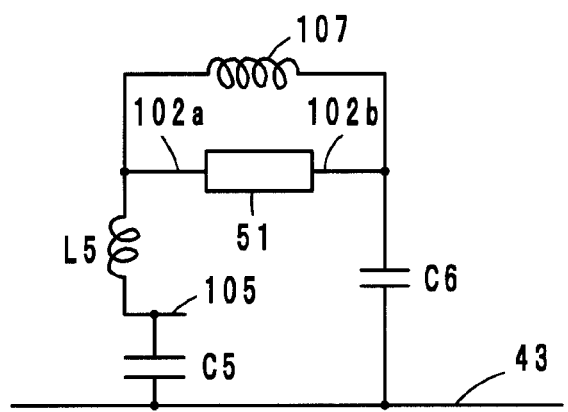

In the tenth preferred embodiment, as illustrated in FIG. 21B, a comparatively small capacitance C6 is formed between an end portion of the radiation electrode 102 and the ground electrode (metal article) 43 and a comparatively large capacitance C5 is formed between the counter electrode 105 and the ground electrode 43. Therefore, the ground electrode 43, which is coupled with the radiation electrode 102 and the counter electrode 105 through the capacitances C6 and C5, is excited. Frequencies at which transmission and reception can be performed are determined by the small capacitance C6. Therefore, the feature that the counter electrode 105 and the ground electrode 43 may be in direct conductive contact with each other is substantially the same as in the eighth preferred embodiment and the ninth preferred embodiment.

In the antenna according to preferred embodiments of the present invention, a magnetic field electrode is provided between a radiation electrode and a feeder portion. That is, the radiation electrode and the magnetic field electrode are preferably integral with each other. With this structure, a feeder pin and a side surface electrode, which were necessary in patch antennas of the background art, are no longer required, a process of manufacturing the antenna is simplified, and the reliability of a connection between the radiation electrode and the feeder portion is significantly improved.

A counter electrode and/or a ground electrode may preferably be arranged so as to oppose the radiation electrode, and the ground electrode may also be arranged so as to oppose the counter electrode. It is preferable that the radiation electrode and the ground electrode are coupled with each other through a capacitance. In addition, the radiation electrode and the counter electrode may be in direct conductive contact with each other through end portions thereof. The counter electrode and the ground electrode may be coupled with each other through a capacitance or may be in direct conductive contact with each other.

Furthermore, in the antenna according to preferred embodiments of the present invention, preferably, an opening is provided in the radiation electrode and the magnetic field electrode is connected to an inner peripheral portion of the opening of the radiation electrode. With this structure, the magnetic field electrode can be arranged inside the radiation electrode and the antenna can be reduced in size.

In addition, in the antenna according to preferred embodiments of the present invention, the magnetic field electrode is preferably defined by a plurality of line-shaped electrodes that are provided on one main surface of an insulator board, first ends of the plurality of line-shaped electrodes being connected to the radiation electrode, second ends of the plurality of line-shaped electrodes being arranged so as to oppose each other, and a feeder portion being defined by the second ends. With this structure, a current is generated in the magnetic field electrode due to a transmission/reception signal. Then, resonance is generated due to the outer peripheral shape of the radiation electrode and the radiation electrode operates as an antenna due to the potential difference generated by the current.

Furthermore, in the antenna according to preferred embodiments of the present invention, preferably, the first ends of the plurality of line-shaped electrodes may be connected to each other and may be connected to the radiation electrode through this connection portion.

In addition, in the antenna according to preferred embodiments of the present invention, it is preferable that the second ends of the plurality of line-shaped electrodes be arranged so as to face each other in the width direction of the insulator board. When the wireless IC chip or the feeder circuit board is coupled with the second ends, since the insulator board does not readily bend in the width direction, there is no risk of the wireless IC chip or the feeder circuit board separating from the insulator board.

In the antenna according to preferred embodiments of the present invention, an opening and a slit may preferably be provided in the radiation electrode, the slit extending from the opening to an edge portion of the radiation electrode, and the magnetic field electrode may arranged in an area surrounding the slit. Thereby, the structure of the antenna can be simplified.

In addition, in the antenna according to preferred embodiments of the present invention, it is preferable that the radiation electrode be defined by a planar electrode having a longitudinal direction and a width direction and that the electrode length in the longitudinal direction correspond to an electrical length of about ½ the wavelength of the frequency band of signals to be transmitted and received. With this structure, the radiation electrode can operate as an antenna that resonates at about ½ the wavelength.

Furthermore, in the antenna according to preferred embodiments of the present invention, it is preferable that an insulator material be arranged so as to cover the radiation electrode on the one main surface of the insulator board and, thereby, the environmental resistance of the radiation electrode can be improved. It is preferable that the thickness of the insulator material be less than the thickness of the insulator board.

In addition, in the antenna according to preferred embodiments of the present invention, the insulator board and/or the insulator material may preferably be formed by injection molding of a resin, for example. The radiation electrode can preferably be formed in an integrated manner so as to be covered by the insulator material and, thereby, the antenna can be formed in a simple manner.

In addition, antennas and wireless IC devices according to preferred embodiments of the present invention are not limited to those of the above-described preferred embodiments and can be modified in various ways within the scope of the present invention.

In particular, in the above-described preferred embodiments, an insulator material was arranged so as to cover the radiation electrode on the one main surface side of the insulator board, but the insulator material may be omitted depending on the usage environment of the antenna or wireless IC device. In addition, main surfaces of the antenna or wireless IC device according to the above-described preferred embodiments had a rectangular shape but they are not limited to this shape and may, for example, have a circular or oval shape.

As has been described above, preferred embodiments of the present invention is useful in antennas and wireless IC devices and is particularly preferable in that the manufacturing process is simple and the probability of a poor connection occurring between a feeder portion and a radiation electrode is very low.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An antenna comprising:
an insulator board;
a radiation electrode provided on a first main surface of the insulator board;
a magnetic field electrode provided on the first main surface of the insulator board and connected to the radiation electrode; and
a feeder portion connected to the magnetic field electrode; wherein
the radiation electrode is arranged to surround the magnetic field electrode; and
the antenna is attached to a metal article via a second main surface of the insulator board opposite to the first main surface of the insulator board.

2. The antenna according to claim 1, wherein an opening is provided in the radiation electrode and the magnetic field electrode is connected to an inner peripheral portion of the opening of the radiation electrode.

3. The antenna according to claim 1, wherein the magnetic field electrode is defined by a plurality of line-shaped electrodes provided on the first main surface of the insulator board, first ends of the plurality of line-shaped electrodes are connected to the radiation electrode and second ends of the plurality of line-shaped electrodes are arranged so as to face each other, and the feeder portion is defined by the second ends of the plurality of line-shaped electrodes.

4. The antenna according to claim 3, wherein the first ends of the plurality of line-shaped electrodes are connected to each other at a connection point and are connected to the radiation electrode through the connection point.

5. The antenna according to claim 1, wherein an opening and a slit are provided in the radiation electrode, the slit extending from the opening to an edge portion of the radiation electrode, and the magnetic field electrode is provided in an area surrounding the opening.

6. The antenna according to claim 1, wherein the feeder portion is arranged such that components of the feeder portion face each other in a width direction of the insulator board.

7. The antenna according to claim 1, wherein the radiation electrode is defined by a planar electrode having a longitudinal direction and a width direction, and an electrode length of the planar electrode in the longitudinal direction corresponds to an electrical length of substantially ½ a wavelength of a frequency band of signals to be transmitted and received.

8. The antenna according to claim 1, wherein an insulator material is arranged so as to cover the radiation electrode on the first main surface of the insulator board.

9. The antenna according to claim 8, wherein at least one of the insulator board or the insulator material is made of an injection molded resin.

10. The antenna according to claim 1, wherein a thickness of the insulator material is less than a thickness of the insulator board.

11. A wireless IC device comprising:
the antenna according to claim 1; and
a wireless IC; wherein
the wireless IC is arranged so as to be coupled with the feeder portion.

12. A wireless IC device comprising:
the antenna according to claim 1;
a wireless IC;
an electromagnetic coupling module coupled with the wireless IC and including a feeder circuit board that includes a feeder circuit including at least one of a resonance circuit or a matching circuit that includes an inductance element; wherein
the electromagnetic coupling module is arranged so as to be coupled with the feeder portion.

13. An antenna comprising:
an insulator board;
a radiation electrode provided on a first main surface of the insulator board;
a ground electrode arranged on a second main surface of the insulator board so as to oppose the radiation electrode;
a magnetic field electrode provided on the first main surface of the insulator board and connected to the radiation electrode; and
a feeder portion connected to the magnetic field electrode; wherein
the radiation electrode is arranged to surround the magnetic field electrode.

14. The antenna according to claim 13, wherein the radiation electrode and the ground electrode are coupled with each other through a capacitance.

15. An antenna comprising:
an insulator board;
a radiation electrode provided on a first main surface of an insulator board;
a counter electrode arranged on a second main surface of the insulator board so as to oppose the radiation electrode, the counter electrode being coupled with the radiation electrode through a capacitance;
a magnetic field electrode provided on the first main surface of the insulator board and connected to the radiation electrode; and
a feeder portion connected to the magnetic field electrode; wherein
the radiation electrode is arranged to surround the magnetic field electrode.

16. The antenna according to claim 15, further comprising a ground electrode arranged so as to oppose the counter electrode.

17. The antenna according to claim 16, wherein the counter electrode and the ground electrode are coupled with each other through a capacitance.

18. The antenna according to claim 16, wherein the counter electrode and the ground electrode are in direct conductive contact with each other.

19. The antenna according to claim 15, wherein the radiation electrode and the counter electrode are in direct conductive contact with each other through end portions thereof.

* * * * *